US007074697B2

(12) United States Patent
Specht et al.

(10) Patent No.: US 7,074,697 B2
(45) Date of Patent: Jul. 11, 2006

(54) DOPING-ASSISTED DEFECT CONTROL IN COMPOUND SEMICONDUCTORS

(75) Inventors: Petra Specht, Piedmont, CA (US);
Eicke R. Weber, Oakland, CA (US);
Todd Russell Weatherford, Prunedale, CA (US)

(73) Assignees: The Regents of the University of California, Oakland, CA (US); The United States of America as represented by the Secretary of the Navy, Washington, DC (US)

( * ) Notice: Subject to any disclaimer, the term of this patent is extended or adjusted under 35 U.S.C. 154(b) by 17 days.

(21) Appl. No.: 10/706,610

(22) Filed: Nov. 12, 2003

(65) Prior Publication Data

US 2005/0020033 A1     Jan. 27, 2005

Related U.S. Application Data

(63) Continuation-in-part of application No. 09/795,295, filed on Oct. 1, 1999, now abandoned.

(60) Provisional application No. 60/157,387, filed on Oct. 1, 1999.

(51) Int. Cl.
*H01L 21/20* (2006.01)

(52) U.S. Cl. .................................... 438/478; 438/510

(58) Field of Classification Search ........ 438/507–509, 438/510, 542–543, 565, 569, 478
See application file for complete search history.

(56) References Cited

OTHER PUBLICATIONS

Chaldyshev et al., "Effect of isovalent indium doping on excess arsenic in gallium arsenide grown by molecular-beam epitaxy at low temperatures", Jul. 1998, Semiconductors, vol. 32, No. 7, pp. 692-695.*
Bert et al., "Enhanced arsenic excess in low-temperature grown GaAs due to indium doping", Jun. 1997, Appl. Phys. Lett. 70 (23), pp. 3146-3148.*
F.W. Smith et al, "New MBE Buffer Used to Eliminate Backgating in GaAs MESFET's", IEEE Electron Device Letters, vol. 9, No. 2, 1988, pp. 77-80.
G.M. Metze et al, "Effects of Very Low Growth Rates on GaAs Grown by Molecular Beam Epitaxy at Low Substrate Temperatures", Applied Physics Letters, vol. 42, No. 9, May 1, 1983, pp. 818-820.
S. Gupta et al, "Ultrafast Carrier Dynamics in III-V Semiconductors Grown by Molecular Beam Epitaxy at Very Low Substrate Temperatures", IEEE Journal of Quantum Electronics, vol. 28, No. 10, Oct. 1992, pp. 2464 2472.

S. Gupta et al, "Subpicosecond Carrier Lifetime in GaAs Grown by Molecular Beam Epitaxy at Low Temperatures", Applied Physics Letters, vol. 59, No. 25, Dec. 16, 1991, pp. 3276-3278.
T.R. Weatherford et al, "Effects of Low Temperature Buffer Layer Thickness and Growth Temperature on the SEE Sensitivity of GaAs HIGFET Circuits", IEEE Transactions on Nuclear Science, vol. 44, No. 6, Dec. 1997, pp. 2298-2305.
D.C. Look, "On Compensation and Conductivity Models for Molecular Beam Epitaxial GaAs Grown at Low Temperature", Journal of Applied Physics, vol. 70, No. 6, Sep. 15, 1991, pp. 3148-5151.
M. Kaminska et al, "High Resistivity of Low Temperature MBE GaAs", Semi Insulating III-V Materials, Proceedings of the 6th Conference on Semi insulating III V Materials, May 13-16, 1990, Toronto, Canada, pp. 111 116.
X. Liu et al, "Native Point Defects in Low Temperature Grown GaAs", Applied Physics Letters, vol. 67, No. 2, Jul. 10, 1995, pp. 279-281.
M. Luysberg et al, "Effects of the Growth Temperature and As/Ga Flux Ratio on the Incorporation of Excess As into Low Temperature Grown GaAs", Journal of Applied Physics, vol. 83, No. 1, Jan. 1, 1998, pp. 561-566.
Zuzanna Liliental-Weber, "TEM Study of the Structure of MBE GaAs Layers Grown at Low Temperature", Materials Research Society Symposium Proceedings, San Francisco, California, Apr. 16-19, 1990; vol. 198, pp. 371-376.
M.R. Melloch et al, "Formation of Arsenic Precipitates in GaAs Buffer Layers Grown by Molecular Beam Epitaxy at Low Substrate Temperatures", Applied Physics Letters, vol. 57, No. 15, Oct. 8, 1990, pp. 1531 1533.

(Continued)

*Primary Examiner*—Evan Pert
(74) *Attorney, Agent, or Firm*—Michaelson & Associates; Peter L. Michaelson; George Wolken, Jr.

(57) ABSTRACT

The present invention relates to the production of thin film epilayers of III–V and other compounds with acceptor doping wherein the acceptor thermally stabilizes the epilayer, stabilize the naturally incorporated native defect population and therewith maintain the epilayer's beneficial properties upon annealing among other advantageous effects. In particular, balanced doping in which the acceptor concentration is similar to (but does not exceed) the antisite defects in the as-grown material is shown to be particularly advantageous in providing thermal stability, high resistivity and ultrashort trapping times. In particular, MBE growth of LT-GaAs epilayers with balanced Be doping is described in detail. The growth conditions greatly enhance the materials reproducibility (that is, the yield in processed devices). Such growth techniques can be transferred to other III–V materials if the growth conditions are accurately reproduced. Materials produced herein also demonstrate advantages in reproducibility, reliability and radiation hardening.

10 Claims, 11 Drawing Sheets

OTHER PUBLICATIONS

X. Liu et al, "Mechanism Responsible for the Semi Insulating Properties of Low Temperature Grown GaAs", Applied Physics Letters, vol. 65, No. 23, Dec. 5, 1994, pp. 3002-3004.

B.J. Lin et al, "Anomalies in MODFET's with a Low Temperature Buffer", IEEE Transactions on Electron Devices, vol. 37, No. 1, Jan. 1990, pp. 46-50.

Z. Liliental Weber et al, "Structural Properties of the GaAs Layers Grown by MBE at Low Temperatures", Semi Insulating III-V Materials, Proceedings of the 8th Conference on Semi insulating III-V Materials, Jun. 6-10, 1994, Warsaw, Poland, pp. 305-317.

P. Specht et al, "Defect Control in As-Rich GaAs", Materials Science Forum, Proceedings of the 19th International Conference on Defects in Semiconductors, Aveiro, Portugal, Jul. 1997, vols. 258-262, pp. 951-956.

M.K. Weilmeier et al, "A New Optical Temperature Measurement Technique for Semiconductor Substrates in Molecular Beam Epitaxy", Canadian Journal of Physics, vol. 69, 1991, pp. 422-426.

U. Siegner et al, "Ultrafast High-Intensity Nonlinear Absorption Dynamics in Low Temperature Grown Gallium Arsenide", Applied Physics Letters, vol. 69, No. 17, Oct. 21, 1996, pp. 2566-2568.

P. Grenier et al, "Subband Gap Carrier Dynamics in Low Temperature Grown GaAs", Applied Physics Letters, vol. 70, No. 15, Apr. 14, 1997, pp. 1998 2000.

T.S. Sonsnowski et al, "High-Carrier-Density Electron Dynamics in Low Temperature Grown GaAs" Applied Physics Letters, vol. 70, No. 24, Jun. 16, 1997, pp. 3245-3247.

M.R. Melloch et al, "Formation of Two Dimensional Arsenic Precipitate Arrays in GaAs", Applied Physics Letters, vol. 61, No. 2, Jul. 13, 1992, pp. 177-179.

M. Kaminska et al, "Hopping Conduction of Low Temperature GaAs Within an Arsenic Antisite Defect Band", 20th International Conference on The Physics of Semiconductors, Aug. 6-10, 1990, Thessaloniki, Greece, vol. 1, pp. 473-476.

D.C. Look et al, "Anomalous Hall-Effect Results in Low Temperature Molecular Beam Epitaxial GaAs: Hopping in a Dense EL2 Like Band", Physical Review B, vol. 42, No. 6, Aug. 15, 1990, pp. 3578-3581.

J. Gebauer et al, "Defect Identification in GaAs Grown at Low Temperatures by Positron Annihilation", Journal of Applied Physics, vol. 87, No. 12, Jun. 15, 2000, pp. 8368-8379.

E.R. Weber et al, "Identification of AsGa Antisites in Plastically Deformed GaAs", Journal of Applied Physics, vol. 53, No. 9, Sep. 1982, pp. 6140-6143.

D.E. Bliss et al, "Annealing Characteristics of Low Temperature Grown GaAs:Be", Materials Research Society Symposium Proceedings, Dec. 4-6, 1991, Boston, Massachusetts, vol. 241, pp. 93-98.

J. Gebauer et al, "Identification and Quantification of Defects in Highly Si Doped GaAs by Positron Annihilation and Scanning Tunneling Microscopy" Physical Review Letters, vol. 78, No. 17, Apr. 28, 1997, pp. 3334-3337.

B.I. Shklovskii et al, "A General Description of Hopping Conduction in Lightly Doped Semiconductors", Chapter 4, Section 1, Electronic Properties of Doped Semiconductors, (© 1984, Springer Verlag), pp. 74-82.

R.C. Lutz et al, "Thermal Stabilization of Non Stoichiometric GaAs through Beryllium Doping", Materials Research Society Symposium Proceedings, Apr. 13-17, 1998, San Francisco, California, vol. 510, pp. 55-59.

S.M. Sze, Appendix H, Physics of Semiconductor Devices, 2nd ed., (© 1981, John Wiley & Sons, Inc.), pp. 850 851.

J. Kruger et al, "The Influence of Native Point Defects on the Performance of Diodes Built on Neutron Irradiated Semi Insulating GaAs", Semiconducting and Insulating Materials, Proceedings of the 9th Conference on Semiconducting and Insulating Materials (SIMC'9), Apr. 29-May 3, 1996, Toulouse, France, pp. 345 348.

M.A. Zaidi et al, "Minority Carrier Capture Cross Section of the EL2 Defect in GaAs", Applied Physics Letters, vol. 61, No. 20, Nov. 16, 1992, pp. 2452-2454.

M. Oestreich et al, "Picosecond Spectroscopy of Plasctically Deformed GaAs", Journal of Luminescence, vol. 58, (© 1994, Elsevier Science B.V.), pp. 123-126.

A. Mitonneau et al, "Electron and Hole Capture Cross Sections at Deep Centers in Gallium Arsenide", Revue de Physique Appliquee, vol. 14, Oct. 1979, pp. 853-861.

P. Specht et al, "A Standard Low Temperature GAAS Growth: Prerequisite for Defect Engineering", 4th Symposium on Non Stoichiometric III-V Compounds, Pacific Grove, CA, Oct. 2-4, 2002, pp. 31-36.

Sprecht et al, "Defect Control in As-Rich GaAs", Materials Science Forum, vols. 258-263, Switzerland, 1997, pp. 951-956.

Lutz et al, "Electrical Properties and Thermal Stability of Be-doped Non-stoichiometric GaAs", Semiconducting and Insulating Materials, 1998, Proceedings of the 10th Conference, Berkeley, CA, Jun. 1, 1998-Jun. 5, 1998, pp. 113-117.

Zhao et al, "Time Resolved Reflectivity Measurement of Thermally Stabilized Low Temperature Grown GaAs Doped with Beryllium", Semiconducting and Insulating Materials, 1998, Proceedings of the 10th Conference, Berkeley, CA, Jun. 1, 1998-Jun. 5, 1998, pp. 130-133.

Maltez et al, "Structural and Photoluminescence Analysis of Er implanted LT-GaAs", Semiconducting and Insulating Materials, 1998, Proceedings of the 10th Conference, Berkeley, CA, Jun. 1, 1998-Jun. 5, 1998, pp. 122-125.

Luysberg et al, "Control of Stoichiometry Dependent Defects in Low Temperature GaAs", Semiconducting and Semi Insulating Materials Conference, Toulouse, France, Apr. 29, 1996-May 3, 1996, pp. 21-26.

P. Specht et al, "Conductive Non-Stoichiometric III V Compounds: Properties and Prospective Applications", Symposium on Non-Stoichiometric III-V Compounds, Oct. 8, 10, 2001, Erlangen, Germany, pp. 1-6.

P. Specht et al, "Defect engineering in MBE grown GaAs based materials", Int. Conf. SIMC-XI, Australia, 2000, 4 pages.

* cited by examiner

Fig.3: As precipitates in LT-GaAs:Be (700°C, 30min)

DOPING-ASSISTED DEFECT CONTROL IN COMPOUND SEMICONDUCTORS

CROSS REFERENCE TO RELATED APPLICATIONS

This application is a continuation-in-part of application Ser. No. 09/795,295 filed Oct. 1, 1999, now abandoned, and claims priority therefrom. The entire contents of application Ser. No. 09/795,295 are incorporated herein by reference and made a part hereof for all purposes.

STATEMENT REGARDING FEDERALLY SPONSORED RESEARCH OR DEVELOPMENT

This invention was made with Government support under Contract (Grant) No. F49620-98-1-0135 of the Air Force Office of Scientific Research, Contract (Grant) No. F49620-95-1-0091 of the Joint Services Electronics Program. Facilities were used at the Center for Advanced Materials at the Lawrence Berkeley National Laboratories, supported by the U.S. Department of Energy under Contract (Grant) No. DE-AC03-76SF00098. The Government has certain rights to this invention.

BACKGROUND OF THE INVENTION

1. Field of Invention

This invention relates generally to the field of semiconductor materials and processing, and more particularly, to thin film epitaxy of compound semiconductors at low temperatures, and most particularly, to III–V compound semiconductors such as gallium arsenide.

2. Description of the Prior Art

Numerous organic and inorganic materials behave as electrical semiconductors. Among the inorganic semiconductors, elemental semiconductors such as silicon have formed the basis for much of modern integrated circuit technology. However, compound semiconductors comprising more than a single chemical species can have interesting optical and/or electronic properties not obtainable in conventional semiconducting materials such as silicon. In particular, gallium arsenide (GaAs) is an example of a direct bandgap semiconductor in which, roughly speaking, electronic transitions can occur between the top of the valence electronic energy band and the bottom of the conduction electronic energy band without the necessity for a concurrent change in the momentum of the transitioning electron(s).

Electronic transitions in direct bandgap materials are typically very efficient and, among other things, typically give such materials interesting and useful optical properties. As a result, GaAs is an important material in many optoelectronic applications such as light-emitting-diodes, semiconductor lasers, among others.

In addition, the electronic structure and properties of GaAs offer advantages in terms of the fabrication of high-speed electronic devices. Therefore, GaAs also is finding application in the highest-speed electronic devices for use in conjunction with high-speed computing, high-speed data processing, high frequency microwaves, among other applications.

GaAs exists in the form of bulk crystals, but can also be deposited as high quality thin films by molecular beam epitaxy (MBE), organmetallic vapor phase epitaxy (OVPE), among other deposition techniques. Such deposition techniques permit the deposition and formation of GaAs thin films but also, and significantly, permit the deposition of alloys of GaAs. That is, a thin film of GaAs is deposited along with one or more additional components to form a thin film compound or alloy. Typical GaAs alloys comprise ternary compounds in which a third component is included, such as aluminum (forming AlGaAs), indium (forming InGaAs) as well as dilute nitrides GaAsN containing small amounts of nitrogen. Ga is typically substituted by aluminum (Al) and/or indium (In) while As is typically substituted by nitrogen (N), phosphorous (P) and/or antimony (Sb) resulting in a group of III–V compounds or alloys, including ternary alloys such as GaAsP, GaAsSb, among others. While quaternary alloys (such as InGaAsN, InGaAsP) and even quinternary alloys (GaInAsNPb) are known, our primary concern herein will be directed towards the ternary alloys of III–V compounds. Generally, such ternary alloys derived from GaAs are only obtained in thin film depositions, adding to the practical interest of thin film GaAs in the fabrication of practical electronic and optoelectronic devices.

Typically, thin film GaAs is deposited (or grown) at temperatures of approximately 500 deg. C. to approximately 600 deg. C., although many GaAs films are grown at a temperature close to approximately 580 deg. C., the temperature that is typically sufficient to evaporate the top oxide cover layer. Ternary alloys are typically grown at different temperatures: AlGaAs typically at a higher temperature than GaAs while InGaAs typically at lower temperature. Under such conditions, impurities from the ambient conditions in the deposition chamber and/or residing in the source material(s) typically are included in the GaAs film, tending to degrade its properties. For example, inclusion of such impurities in the GaAs film typically leads to films having a carrier concentration in the range of approximately $10^{14}$ to $10^{15}$ carriers/(cubic centimeter-cc) or more. That is, typical GaAs thin films are conductive, either n-type conductive or p-type conductive depending on the particular impurity. Generally such films are n-type conductive since impurities tend to be electron-donors, but p-type conductive films are also known. Conductive GaAs thin films are disfavored in the fabrication of electronic devices, tending to allow unwanted and deleterious electronic interaction between components and devices intended to be electrically isolated.

It has been observed that GaAs deposited at low temperature (LT-GaAs) can lead to the formation of thin films having much improved resistivity. That is, LT-GaAs deposited typically in the temperature range from approximately 200 deg. C. to approximately 400 deg. C. can have carrier concentrations as low as approximately $10^8$ to $10^9$ carriers/cc, a factor of about a million improvement (increase) in resistivity (or decrease in conductivity). Thus, LT-GaAs would be favored over conventional GaAs films as a base on which to fabricate electronic devices, leading to much improved device isolation.

Note, however, that for films grown near or below approximately 300 deg. C., conductivity may be undesirably high despite low carrier concentration due to "hopping conduction" arising from direct electron hopping from defect to defect when a high concentration of defects is present. Hopping conduction can be cured to produce a high resistivity film by a suitable annealing step, typically annealing the film at temperatures around or exceeding approximately 400 deg. C.

In addition to higher resistivity, it has been observed that LT-GaAs has a much shorter carrier lifetime following optical excitation. That is, electromagnetic radiation impinging on GaAs typically causes electronic transitions and the creation of mobile carriers of electronic charge. LT-GaAs has the advantageous property that such carriers disappear (are trapped) within an extremely short time, perhaps as short as picoseconds ($10^{-12}$ sec) or less. Such ultrashort carrier lifetimes are advantageously used in very high-speed electronic devices, perhaps operating in the range of terahertz ($10^{12}$ Hz).

However, fully utilizing the favorable properties of LT-GaAs in practical devices faces several challenges. The formation of LT-GaAs is typically not highly reproducible. Seemingly minor changes in processing conditions can lead to markedly different properties in the ultimate film of LT-GaAs.

Additionally, use in practical electronic devices requires that LT-GaAs survive subsequent processing with its properties intact or, at a minimum, with its properties altered in predictable and reproducible ways. In particular, processing steps used in typical electronic device fabrication often occur at temperatures greatly exceeding the deposition temperatures of LT-GaAs. Such high temperatures often change the physical, chemical and electrical properties of LT-GaAs so as to render it unsuitable for its intended use.

In view of the foregoing, a need exists in the art for methods for the production of LT-GaAs in a controlled and reproducible manner and for producing forms of LT-GaAs capable of surviving high-temperature or other processing with favorable properties. The present invention relates to methods for doping-assisted control of defects in LT-GaAs to achieve these and other objectives, and to the forms of LT-GaAs thereby produced.

SUMMARY OF THE INVENTION

Accordingly and advantageously the present invention includes the production of thin film epilayers of III–V and other compounds with acceptor doping wherein the acceptor thermally stabilizes the layer as well as other advantageous effects. In particular, balanced doping in which the acceptor concentration is similar to (but does not exceed) the antisite defects in the as-grown material is shown to be particularly advantageous in providing thermal stability, high resistivity and ultrashort trapping times. In particular, MBE growth of LT-GaAs epilayers with balanced Be doping is described in detail. The growth conditions greatly enhance the materials reproducibility (that is, the yield in processed devices). Such growth techniques can be transferred to other III–V materials if the growth conditions are accurately reproduced. Materials produced herein also demonstrate advantages in reproducibility, reliability and radiation hardening These and other advantages are achieved in accordance with the present invention as described in detail below.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not to scale.

The techniques of the present invention can readily be understood by considering the following detailed description in conjunction with the accompanying drawings, in which.

DETAILED DESCRIPTION OF THE INVENTION

Figure 1:
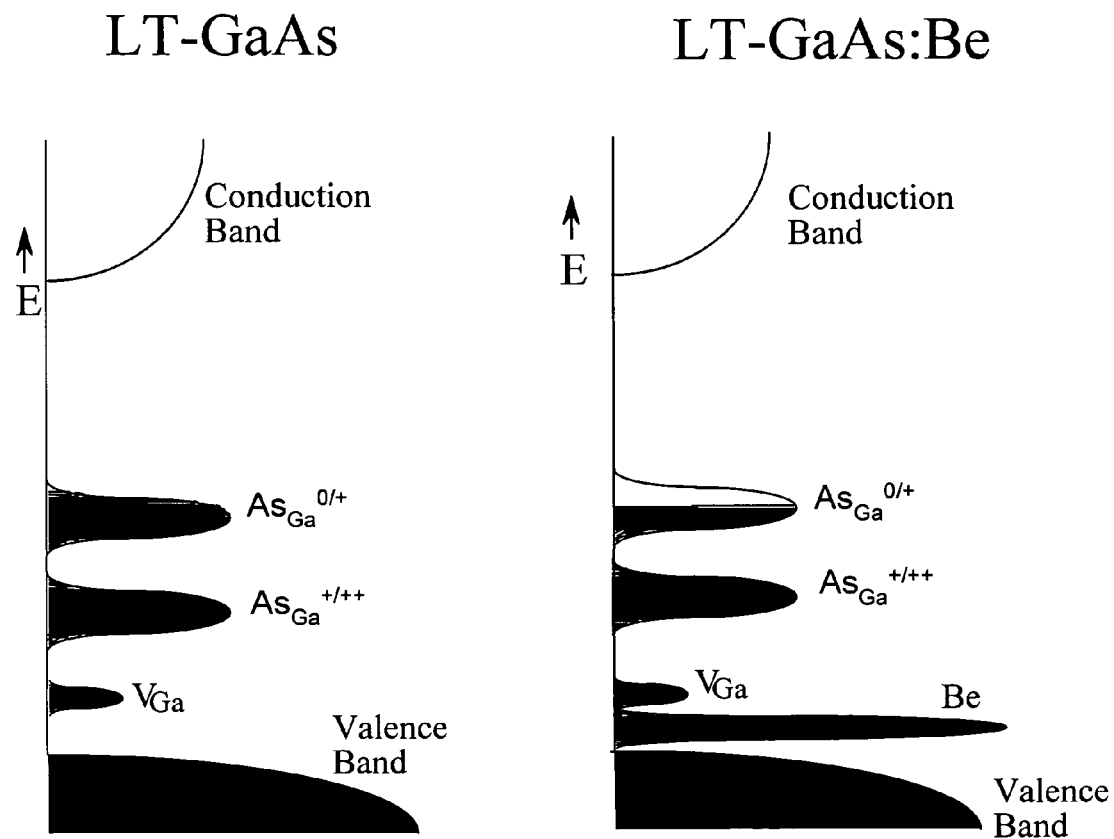
FIG. 1 depicts qualitative energy band structure of undoped and Be-doped LT-GaAs formed in accordance with some embodiments of the invention.

After considering the following description, those skilled in the art will clearly realize that the teachings of the invention can be readily utilized in the fabrication of low temperature compound semiconductors, particularly, LT-GaAs. To be concrete in our discussion, we describe in detail the example of LT-GaAs doped with beryllium (Be). However, it will be apparent to those having ordinary skills in the art that similar procedures can be used with other compound semiconductors and employing dopants other than Be. Specific materials and properties are mentioned where appropriate.

Since Smith et al. (1988) reported the growth of GaAs at low temperatures ($T_G$=200 deg. C.) for buffer layer applications [1], the research on highly non-stoichiometric GaAs has continuously increased. The interest in low temperature (LT) GaAs is focused on two electronic properties. First, the material exhibits ultra-fast carrier trapping times (<1 ps), when grown below $T_G$=230 deg. C. [2], which can be exploited in opto-electronics or as a carrier trap for radiation hardened devices [3,4]. Secondly, after an appropriate annealing procedure, LT-GaAs is highly insulating, with resistivities above $10^7$ Ωcm [5,6]. The supersaturation of native point defects, mainly As antisites, cause these special properties as well as increase the lattice constant of as-grown LT-GaAs [7]. Arsenic antisites are sites within the material that would normally be occupied by gallium in a perfect gallium arsenide crystal, but are occupied instead by arsenic, written in shorthand as $As_{Ga}$.

The incorporation of excess As increases with decreasing growth temperature and/or increasing As/Ga flux ratio [7,8] and also increases with increasing growth rate. In the growth temperature range of approximately 200 deg. C. to approximately 250 deg. C. and for small excess As fluxes (As/Ga flux ratio R greater than about 1.0), the $As_{Ga}$ concentration and therewith the lattice mismatch $\Delta c/c$ change drastically with small growth parameter variations [8]. Consequently, a precise determination and accurate control of the substrate temperature and the As/Ga flux ratio are essential for the control of the $As_{Ga}$ incorporation which is the key parameter for the reproducibility of LT-GaAs epilayers. The crystal quality of the highly non-stoichiometric layers is remarkably good: extended defects (dislocations, stacking faults, precipitates) are generally not found in the as-grown material [9].

Upon thermal annealing at temperatures above 400 deg. C., most of the excess As precipitates to form As clusters and, additionally, out-diffusion of point defects occurs [9, 10]. The As antisite concentration decreases from a maximum of about $10^{20}/cm^3$ down to about $10^{18}/cm^3$ [11] and, as a consequence, the lattice mismatch to the substrate vanishes. The out-diffusion can be detrimental to neighboring layers in device structures requiring the growth of diffusion barrier layers [12]. Insulation is often required for structures deposited on top of the LT-GaAs layer. Therefore, an annealing step of LT-GaAs during the overgrowth of device layers is a common procedure in device processing and aluminum arsenide diffusion barrier layers are indispensable.

LT-GaAs, grown below $T_G$=230 deg. C., exhibits ultrafast carrier lifetimes as measured by optical pump-probe transient absorption or reflection [2, 13, 14]. This time response was reported to correlate in as-grown material with the concentration of ionized As antisites [13]. In undoped LT-GaAs, however, the concentration of $As_{Ga}^+$ does not exceed 10% of the total concentration of $As_{Ga}$. The dominant native acceptor providing the partial compensation of the $As_{Ga}$ double donors was found to be the $V_{Ga}$ triple acceptor [8]. The incorporation of $V_{Ga}$ (and therefore also the $As_{Ga}^+$ concentration) cannot be independently controlled but was found to be dependent on the growth temperature and the BEP ratio in a similar way than the $As_{Ga}$ concentration [8].

The parameters associated with defect control in low temperature semiconductors are not well defined. Accordingly, it would be highly desirable to provide a technique for doping assisted defect control in semiconductor devices grown at low temperatures (or "low temperature semiconductors"). In particular, it would be highly desirable to provide a technique to increase and control the ionization ratio of the $As_{Ga}$ in low temperature GaAs.

The invention includes growing films of GaAs at a temperature between approximately 200 and 400 deg. C. by molecular beam epitaxy ("epilayers"). The GaAs is doped during growth with Be at a temperature greater than about 250 deg. C. wherein the concentration of Be dopant is typically similar or slightly lower than the concentration of defects in the native material. Thus, the dopant concentration is adjusted according to the growth conditions to achieve this relationship.

The epilayer growth is performed by molecular beam epitaxy (MBE) under As-rich conditions, as is typically done in the MBE growth of GaAs. The Ga/As flux ratio is chosen high enough such that the experimental uncertainty for this flux ratio growth parameter does not result in a change of $As_{Ga}$ of more than about 10%. A parameter range found to give satisfactory results is a beam equivalent pressure (BEP) value between about 20 and about 40. Note that a flux ratio of 1 corresponds to a BEP of about 11. The growth rate is advantageously chosen to be greater than about 0.2 micron/hr and less than about 1.8 micron/hr. (micron=$10^{-6}$ meter), and the influence of this growth rate on the incorporation of native defects needs to be taken into account. For example: an LT-GaAs epilayer nominally grown at about 300 deg. C. with a BEP ratio about 20 and a growth rate about 1 micron/hr. will yield an $As_{Ga}$ concentration of approximately $(1.5\pm0.2)\times10^{18}$ per cc. With poorly controlled growth rates, this value can be $(2.5\pm1.0)\times10^{18}$ per cc. If doped with Be at a concentration of $(1.0\pm0.1)\times10^{18}$, the resulting epilayer will be "balanced." That is, the majority of $As_{Ga}$ defects will be singly ionized, but the epilayer remains insulating. The dopant concentration should not exceed the native defect concentration. Such epilayers exhibit ultrafast time response with trapping times around 1 picosecond. Furthermore, annealing the material up to about 700 deg. C. for not more than about 30 minutes does not significantly change the material. That is, it is thermally stabilized. Although the remaining neutral $As_{Ga}$ tend to form tiny precipitates or diffuse out of the epilayer, the ionized antisites $As_{Ga}^+$ are stable. Consequently, careful control of the epilayer growth is important so that most of the As antisites can be ionized via p-doping (such as with Be).

Previous work typically formed $As^+$ antisites largely fortuitously through the introduction of other defects and/or impurities, e.g. Ga vacancies. However, it is found that the introduction of dopants can advantageously produce $As^+$ antisites in a controlled and reproducible way. In particular, it is found to be advantageous that the dopants be introduced in a "balanced" amount. "Balanced" is used herein to indicate a concentration of dopant up to (but not exceeding) the concentration of antisites. For the case of Be doping of LT-GaAs, this means that the Be concentration should approach the concentration of As antisites. Thus, "Balanced" indicates that the concentration of Be or other acceptor dopant is from about 50% up to the concentration of the antisite. However, in practice the upper range of acceptor concentration is typically limited to around 90% to avoid inadvertently exceeding the concentration of antisites.

As depicted in FIG. 1, Be in LT-GaAs introduces an electronic energy level between the valence band and the conduction band, in the "midgap" region. Furthermore, the Be energy level lies below that of the neutral As antisite, making it energetically favorable for the As antisite to lose an electron to the Be. Thus, an acceptor such as Be that has an energy level in the crystal below that of the antisite defect will tend to cause the antisite to lose at least one electron. It is expected that this result will generally hold for acceptor dopants added to compound semiconductors other than LT-GaAs. In particular, acceptors such as carbon (C), magnesium (Mg), copper (Cu), manganese (Mn), iron (Fe), nickel (Ni) and zinc (Zn) have been used in addition to Be. Compound semiconductors such as GaN, GaP, InGaAs, InGaP, AlGaP, among others, are expected to benefit from the introduction of acceptors, particularly balanced concentrations of acceptors.

The influence of Be-doping on the properties of LT-GaAs in terms of the thermal stability, the lattice matching to the substrate, the resistivity and the carrier trapping time are discussed below. The properties of LT-GaAs:Be can be well described by a point defect compensation model employing the doubly donor nature of $As_{Ga}$ antisite defects. LT-GaAs:Be is by far more thermally stable than undoped LT-GaAs with comparable growth parameters in retaining subpicosecond time response. Lattice matched As-rich GaAs can be grown and—by choosing appropriate growth parameters— even then exhibit ultrafast time response because, for higher growth temperatures, a smaller Be concentration is sufficient to achieve ultrafast trapping times. Ultrafast LT-GaAs:Be can be grown at higher growth temperatures than ever obtained before (around 300 deg. C.), where the growth parameters are easier to control. Also, semi-insulation was achieved in as-grown layers with still subpicosecond carrier trapping time. Doubly ionized $As_{Ga}^{++}$ are assumed to be present in highly Be-doped and therefore p-conductive LT-GaAs:Be. In these layers, ultrafast carrier trapping times were achieved as well, which may account for very effective electron trapping of the $As_{Ga}^{++}$. It is deduced from the strain compensation behavior, the point defect concentration analysis, and the increase in thermal stability for both the $As_{Ga}$ and the Be acceptors, that a local correlation or even a complex formation between the $As_{Ga}$ and the $Be_{Ga}$ may occur in balanced LT-GaAs:Be.

The carrier transport in non p-conductive LT-GaAs:Be is, similar to undoped LT-GaAs, dominated by hopping conduction and therefore dependent on the $As_{Ga}$ concentration. First temperature dependent Hall measurements show a reduced hopping activation energy for the Be-doped layers which is minimal for fully (singly) ionized $As_{Ga}$ defects. The effective electron capture cross section for Be-doped LT-GaAs matches with the Shockley-Read-Hall analysis of neutron irradiated bulk GaAs [29], while the available data of undoped LT-GaAs with comparably low ionization ratio of the $As_{Ga}$ does not fit into this analysis. In as-grown and undoped LT-GaAs another mechanism like simultaneous electron and hole trapping at $As_{Ga}^{+}$ and $As_{Ga}^{0}$, respectively, field enhanced trapping due to the high defect concentration or additional hot electron trapping is to be expected.

Balanced LT-GaAs:Be offers new prospects for device applications. The properties of this new generation of non-stoichiometric materials can be designed for special applications by controlling all relevant point defect concentrations. The neutral and ionized concentrations of the dominant $As_{Ga}$ defect can be independently chosen by varying the growth temperature, the As/Ga flux ratio and the Be doping level. The required thermal stability, the lattice matching, the resistivity and the carrier trapping time are dependent on the specific application, such as insulating and radiation hardened buffer layers, ultrafast opto-electronics or saturable absorber mirrors [16]. Doping-assisted control of the native point defects makes new combinations of materials properties possible in low-temperature grown GaAs.

FIG. 1 is a schematic of the density of states diagrams of undoped and Be-doped LT-GaAs. The $V_{Ga}$ defect levels are shown as a single level for simplicity. Upon Be-doping, the Fermi level drops and the concentration of ionized $As_{Ga}+$ matches the Be concentration. For an appropriate Be-doping level dependent on the growth temperature, a larger fraction of the $As_{Ga}$ can be ionized and then act as fast electron traps. This approach enables the growth of ultrafast LT-GaAs at higher growth temperatures than 230 deg. C.

Three beneficial effects were expected: First, the control of the growth parameters is easier at higher temperatures (see e.g. [8]), which enhances the reproducibility of the growth. Secondly, at higher temperatures a smaller amount of native point defects is incorporated. This leads to less pronounced outdiffusion and As precipitate formation, resulting in a more thermally stable material. The third advantage is the possibility of growing lattice matched layers because the small $Be_{Ga}$ acceptors are expected to compensate the strain of the large $As_{Ga}$ point defects produce in undoped LT-GaAs.

Experimental

As-rich GaAs layers were grown by molecular beam epitaxy using a Varian Gen II MBE system. (100) $n^+$-GaAs substrates or undoped semi-insulating (SI) substrates (epi-ready VGF-GaAs from AXT) were wire mounted to a molybdenum block. The substrate temperature was controlled by a thermocouple adjacent to the substrate. The actual temperature reading for the low temperature range was realized by a precision temperature measurement system (Thermionics NW). The system utilizes the diffuse reflectance spectroscopy (DRS) [15]. DRS temperature values are given throughout this paper. The As and Ga fluxes were measured with an ion gauge, which can be moved into the exact substrate position and gives the beam equivalent pressure (BEP) values of both effusion cells. During growth, the BEP ratio was monitored with a mass spectrometer. Its spectrum was calibrated with the ion gauge readings at different growth temperatures. 1.5 μm thick LT-GaAs layers were deposited at a growth rate of 1.0 μm/h. The BEP ratio was kept constant at a value of 20 (As/Ga flux ratio ~1.7). Different series of samples were grown by varying either the growth temperature or the Be concentration. The growth parameters for the LT-GaAs layers are listed in Table I.

TABLE I

Growth parameter, lattice mismatch & carrier trapping time for as-grown LT-GaAs

| series | no. | substrate | $T_G$ [° C.], BEP | [Be] [cm$^{-3}$] | Δc/c [%] | CTT [ps] |
|---|---|---|---|---|---|---|
| I | 1 | $n^+$-GaAs | 240, | 0 | 0.05 | 2.6 |
|  | 2 |  | 20 | 7 * 10$^{19}$ | −0.011 | 1.5 |
|  | 3 |  |  | 2.8 * 10$^{20}$ | −0.13 | 0.7 |
|  | 4 |  |  | 5 * 10$^{20}$ | −0.25 | 0.2 |

TABLE I-continued

Growth parameter, lattice mismatch & carrier trapping time for as-grown LT-GaAs

| series | no. | substrate | $T_G$ [° C.], BEP | [Be] [cm$^{-3}$] | Δc/c [%] | CTT [ps] |
|---|---|---|---|---|---|---|
| II | 1 | SI-GaAs | 250, 20 | 0 | 0.04 | 3.6 |
|  | 2 |  |  | $5 * 10^{18}$ | 0.021 | 1.4 |
|  | 3 |  |  | $2 * 10^{19}$ | 0.00 | 0.9 |
|  | 4 |  |  | $6 * 10^{19}$ | −0.019 | 0.4 |
|  | 5 |  |  | $1 * 10^{20}$ | −0.038 | 0.3 |
| III | 1 | n$^+$-GaAs | 275, 20 | 0 | 0.016 | 5.5 |
|  | 2 |  |  | $7 * 10^{19}$ | −0.024 | 0.3 |
| IV | 1 | SI-GaAs | 250, 20 | $5 * 10^{18}$ | 0.021 | 1.4 |
|  | 2 |  | 270, 20 |  | 0.019 | 1.6 |
|  | 3 |  | 295, 20 |  | 0 | 0.95 |
|  | 4 |  | 320, 20 |  | 0 | 1.0 |
| V | 1 | SI-GaAs | 295, 20 | $3 * 10^{18}$ | 0 | 3.0 |
|  | 2 |  | 320, 20 |  | 0 | 2.4 |

All samples were annealed in proximity to a sacrificial GaAs wafer at 600 deg. C. and 700 deg. C. for 30 minutes in argon ambient to study the thermal stability. The structural properties of the as-grown and annealed layers were studied by cross-sectional transmission electron microscopy (TEM) using a JEOL 4000FX microscope operated at 400 kV.

Be concentrations were measured by secondary ion mass spectroscopy (SIMS). As antisite concentrations were obtained by near-infrared absorption (NIRA: [As$_{Ga}^0$]) and magnetic circular dichroism of absorption (MCDA: [As$_{Ga}^+$]) [7, 13]. The lattice mismatch parallel to the growth direction (Δc/c) was measured by x-ray diffraction (XRD) using the (004) reflection. A pseudomorphic growth was confirmed by determining the lattice mismatch with the asymmetric (224) reflection. (Note that the tetragonal distortion of the pseudomorphic layers Δc/c is roughly twice as large as the actual lattice mismatch Δa/a in a relaxed single crystalline layer.) Hall measurements were carried out in Van der Pauw geometry. The time resolved reflectivity transients were recorded in a pump-probe laser pulse experiment. The laser was operated at a wavelength of 800 nm, 100 fs short pulses were repeated at a frequency of 100 MHz, exciting about 1018 electrons per pump pulse. The recorded data were taken in a time window of about 20 ps, long relaxation times as reported in references [16, 17] were not observed here. The carrier trapping time was determined by an exponential fit on the reflectivity transients. The initial decay may contain carrier thermalization effects [18], which could not be observed here because of the limited resolution due to the laser pulse width. The obtained values in undoped LT-GaAs correspond well with earlier data [13, 14]. Carrier trapping times above 0.2 ps can be reliably resolved. The lattice mismatch and the fitted carrier trapping times (CTT) of the as-grown epilayers are also given in Table 1.

Figure 2:
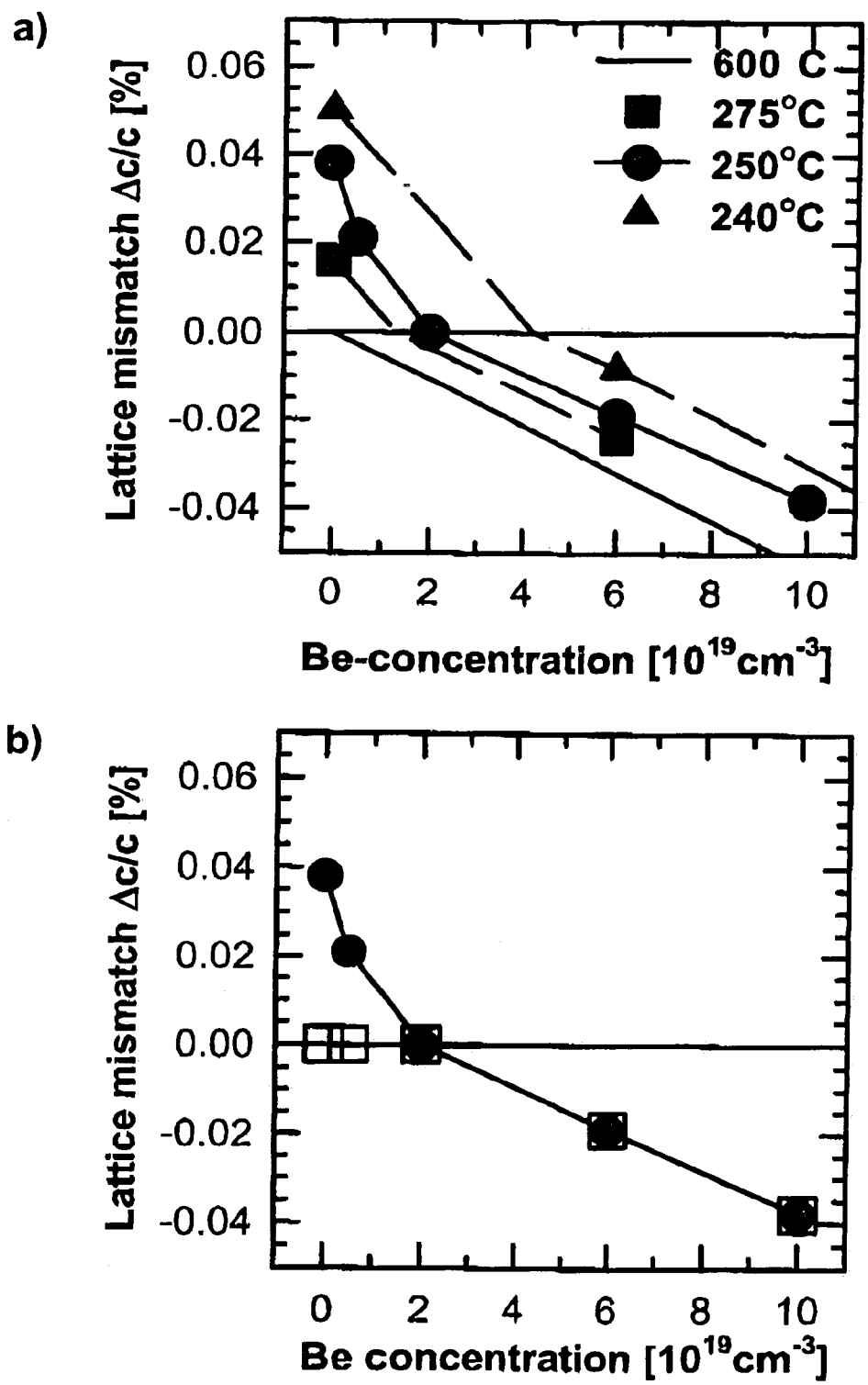
FIG. 2a depicts tetragonal distortion of LT-GaAs:Be layers; $\Delta c/c$ is given for layers grown at different temperatures versus the applied Be concentration. The Be concentrations necessary to achieve lattice matching for the layers grown at 240 deg. C. and 275 deg. C. are estimates.
FIG. 2b depicts annealing behavior of $\Delta c/c$ for the 250 deg. C. series of devices with an annealing time of 30 minutes.

The lattice mismatch of the as-grown samples is shown in FIG. 2a. Upon Be-doping the (positive) lattice mismatch to the substrate decreases. Δc/c becomes negative if the Be concentration is high enough, which also depends on the growth temperature. Consequently, the Be concentration necessary for lattice matching depends on the growth temperature. (The Be concentrations necessary for lattice matching at the growth temperatures of 240 deg. C. and 275 deg. C. as given in FIG. 2a are estimated from the calculated sizes of the native point defects.) Additionally, very high Be concentrations were obtained in As-rich GaAs. While GaAs grown by MBE at the usual growth temperature (around 580 deg. C.) showed surface roughening and a decrease in absolute lattice mismatch for [Be]>10$^{20}$/cm$^3$ [14], in LT-GaAs:Be even the highest Be concentration of $5*10^{20}$/cm$^3$ did not have any effect on the surface roughness as was determined by atomic force microscopy (AFM). A lattice mismatch of −0.25% was measured in these layers [14]. FIG. 2b shows the change in lattice mismatch upon annealing at 600 deg. C. for LT-GaAs:Be, grown at 250 deg. C. The (positive) lattice mismatch in the low-doped layers vanishes as it does in undoped LT-GaAs. The layers with high Be-doping show no change in the (negative) lattice mismatch upon thermal annealing. An increase of the annealing temperature to 700 deg. C. does not change these results.

Figure 3:
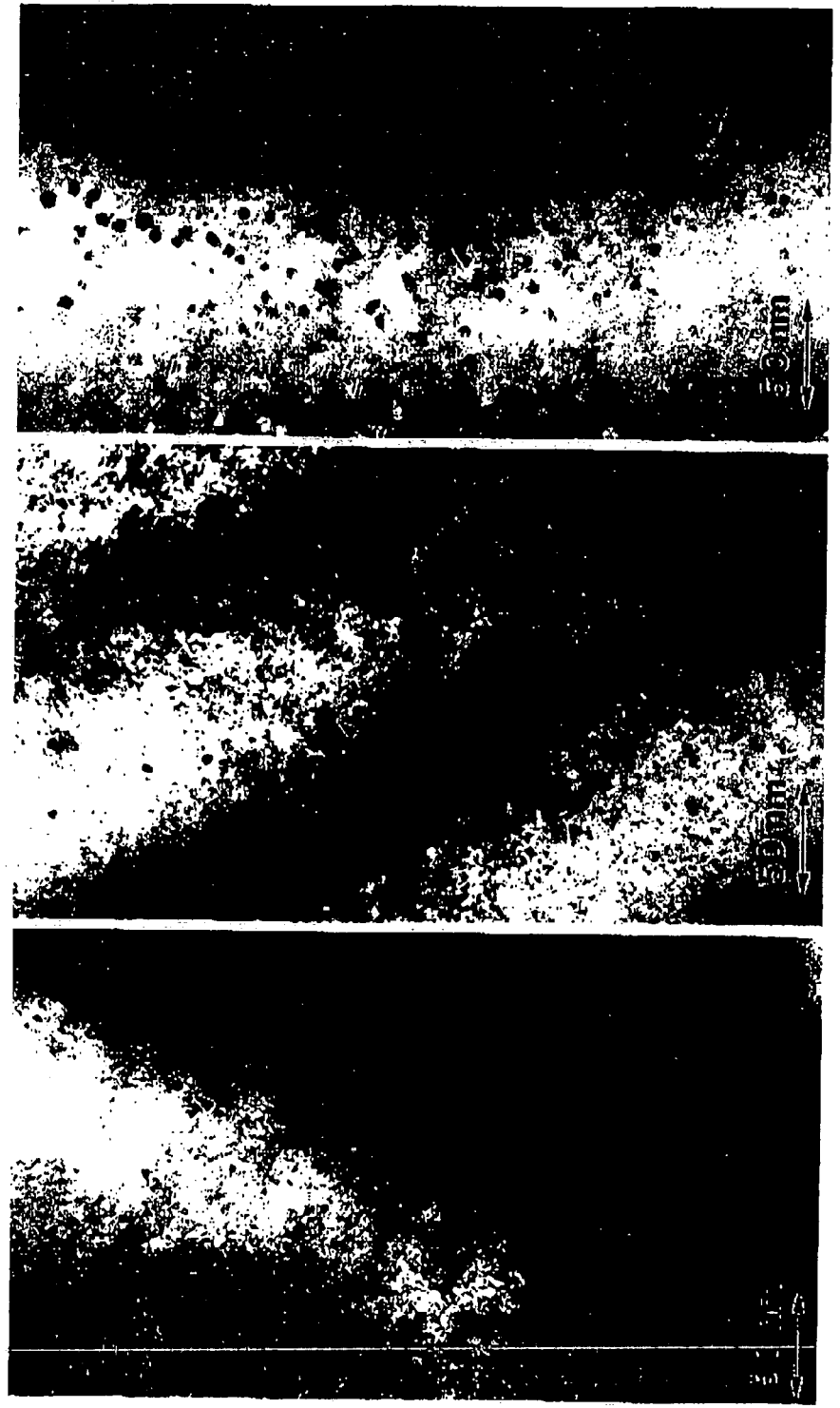
FIG. 3 provides a cross-sectional TEM image of three different lattice matched epilayers after annealing at 700 deg. C. for 30 minutes (proximity). From left to right: 295 deg C., $5*10^{18}/cm^3$ Be/250 deg. C., $2*10^{19}/cm^3$ Be/230 deg. C., $6*10^{19}/cm^3$ Be.

TEM analyses showed that the As precipitate formation is suppressed in LT-GaAs:Be as was reported before by Melloch et al. [19]. FIG. 3 shows a cross-sectional TEM image of three different lattice matched epilayers after annealing at 700 deg. C. The layers were grown at 230 deg. C. with $6*10^{19}$/cm$^3$ Be, at 250 deg. C. with $2*10^{19}$/cm$^3$ Be and at 295 deg. C. with $5*10^{18}$/cm$^3$ Be. After 700 deg. C. annealing for 30 minutes the average size of the As precipitates present in low concentrations are 5.3 nm, 4.3 nm and 2.3 nm, respectively. SIMS profiles taken before and after different annealing steps show no changes in the Be concentration indicating that the Be has been substitutionally incorporated in LT-GaAs as was reported before [19].

Figure 4:
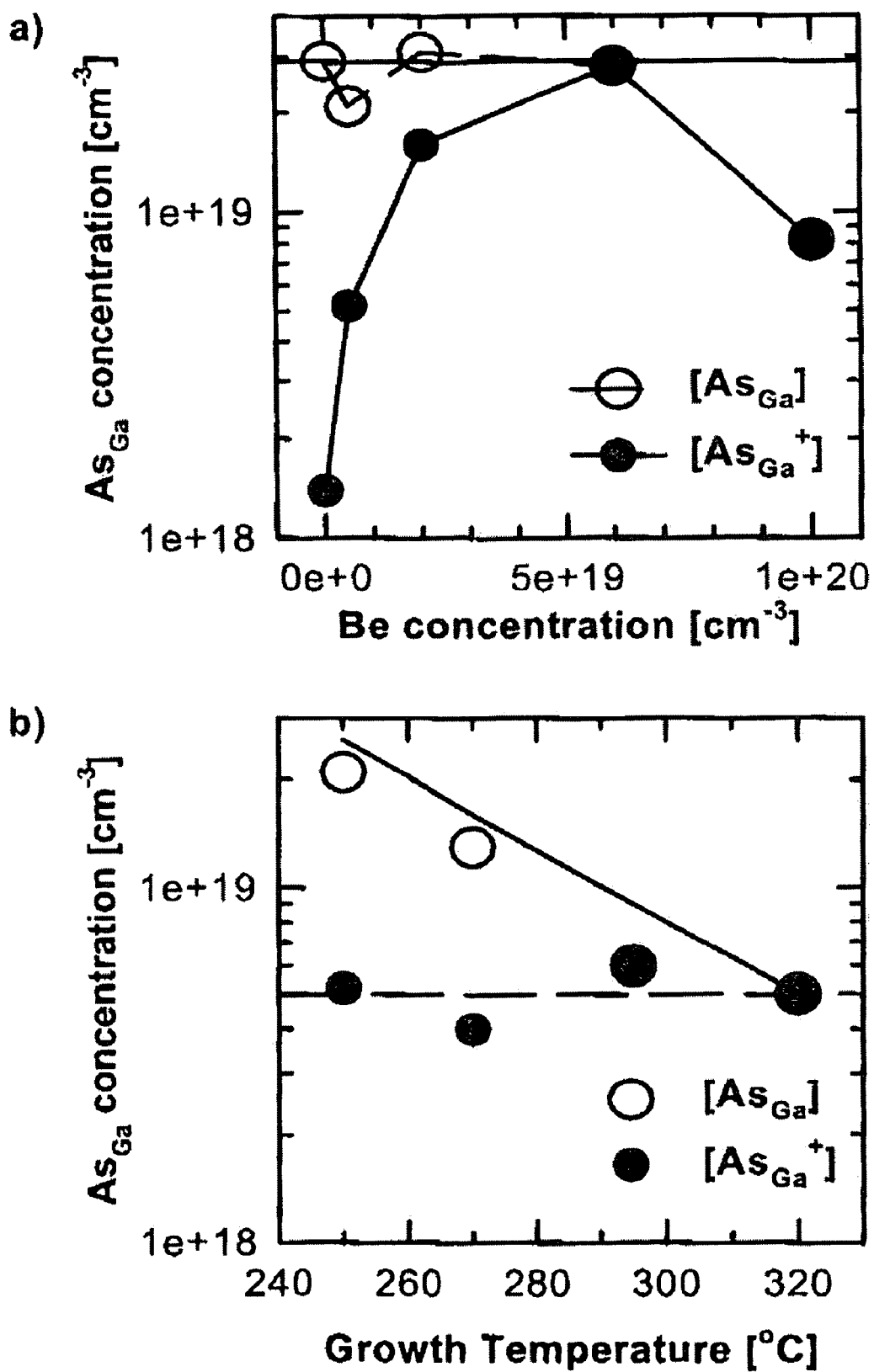
FIG. 4a illustrates the total (open circles) and ionized (closed circles) $As_{Ga}$ concentrations in LT-GaAs:Be versus the Be concentration. The as-grown layers were grown at 250 deg. C., $[AS_{Ga}]=[As_{Ga}^0]+[As_{Ga}^+]$, eventually present doubly charged $As_{Ga}^{++}$ are not presented in this figure, the reference line gives the total $[As_{Ga}]$ for undoped LT-GaAs.
FIG. 4b illustrates the total (open circles) and ionized (closed circles) $As_{Ga}$ concentrations in LT-GaAs:Be dependent on the growth temperature. The as-grown layers were doped with $5*10^{18}/cm^3$ Be (dotted line), $[As_{Ga}]=[As_{Ga}^0]+[As_{Ga}^+]$. The straight line indicates the temperature dependence of $[As_{Ga}]$ in undoped LT-GaAs.

FIG. 4 shows the dependence of the antisite concentrations on the Be concentration (FIG. 4a) and on the growth temperature (FIG. 4b), the values are also given in Table 2.

TABLE 2

Point defect concentrations (in cm$^{-3}$) and fitted lattice mismatch of as-grown layers

| No. | Δc/c [%] | [As$_{Ga}^0$] NIRA | [Be] SIMS | [Be$_{Ga}$] Hall | [As$_{Ga}^+$] MCD | [As$_{Ga}^{++}$] est | Fit: Δc/c |
|---|---|---|---|---|---|---|---|
| II.2 = IV.1 | 0.021 | 1.2E19 | 5E18 | 0 | 5.2E18 | 0 | 0.015 |
| II.3 | 0.00 | 7.9E18 | 2E19 | 0 | 1.4E19 | 0 | 0.006 |
| II.4 | −0.019 | 0 | 6E19 | 6.3E18 | 1.8E19 | 2E19 | −0.017 |
| II.5 | −0.038 | 0 | 1E20 | 3.0E19 | 6.4E18 | 3E19 | −0.039 |
| IV.2 | 0.019 | 1.3E19 | 5E18 | 0 | 4.4E18 | 0 | 0.015 |
| IV.3 | 0 | 0 | 5E18 | 0 | 4.0E18 | 0 | 0 |
| IV.4 | 0 | 0 | 5E18 | 0 | 6.0E18 | 0 | 0 |
| V.1 | 0 | 2.5E18 | 3E18 | 0 | 3.2E18 | 0 | 0.003 |

The total antisite concentration $[As_{Ga}]$ was calculated as the sum of the neutral $[As_{Ga}^0]$ and the singly ionized $[As_{Ga}^+]$. At present, we have no experimental method to determine the concentration of doubly ionized $As_{Ga}^{++}$ for the highly doped LT-GaAs:Be. Therefore, the "total" antisite concentration is just a lower limit in these layers. Upon Be-doping, the ionized antisite concentration increases as expected until all antisites are ionized. This material containing equal As antisite and Be concentrations is near-optimally "balanced" LT-GaAs:Be balanced LT-GaAs:Be: $[As_{Ga}]=[As_{Ga}^+]=[Be_{Ga}^-]=[Be]$ although other concentrations of Be can be used as well.

At higher Be concentrations, the singly ionized As antisite concentration which is now equal to the "total" $[As_{Ga}]$ decreases. This may be an artifact due to the missing doubly charged As antisites, which are likely to be present. FIG. 4b includes also the total antisite concentration of undoped LT-GaAs for comparison. Here, the $[As_{Ga}]$ of the LT-GaAs:Be did not exceed the As antisite concentration of the undoped layers as was reported earlier [14]. The ionized As antisite concentration in LT-GaAs:Be stays constant at the Be doping level until it matches the concentration of the undoped reference layer.

Figure 5:
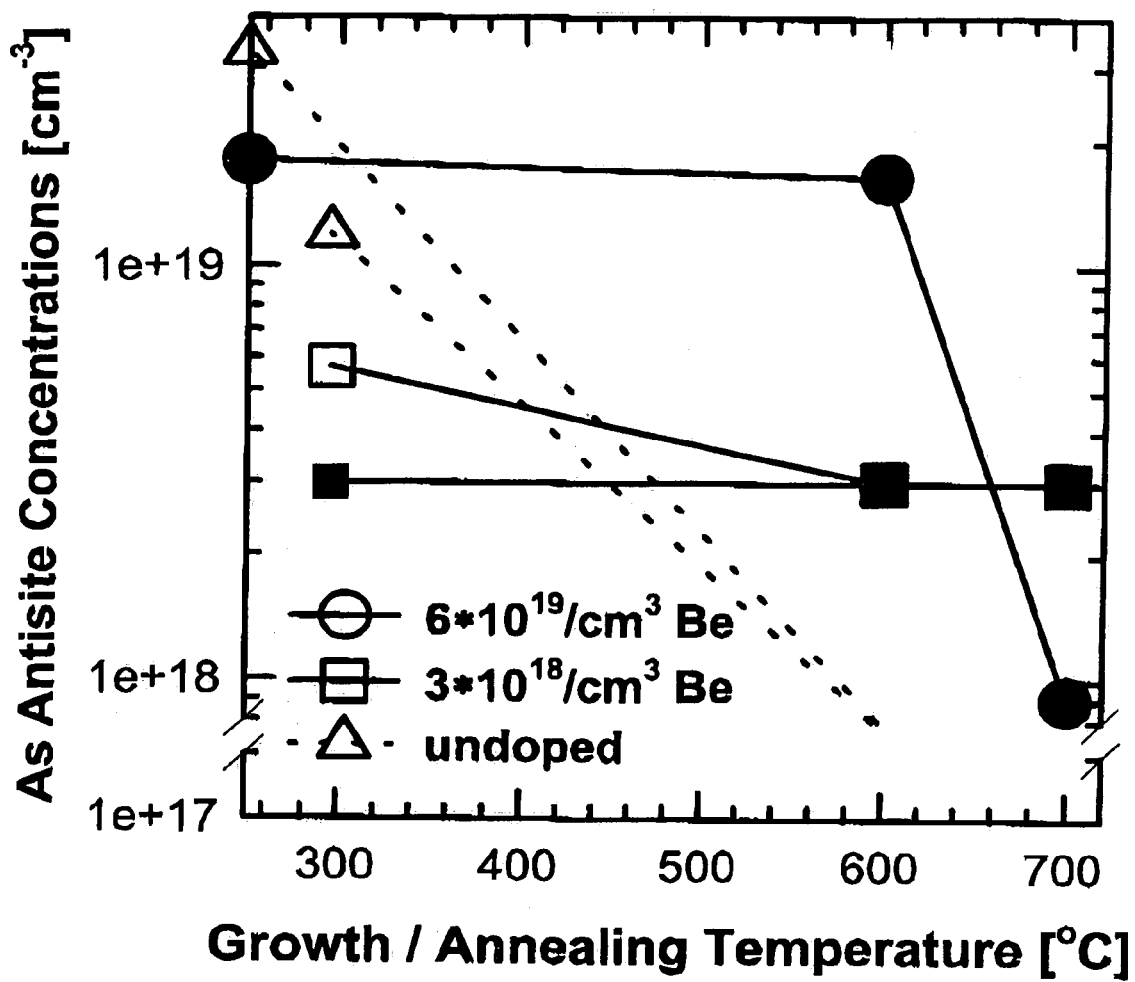
FIG. 5 illustrates annealing behavior of the $As_{Ga}$ concentrations in LT-GaAs:Be, open symbols=$[As_{Ga}]$, closed symbols=$[As_{Ga}^+]$, circles: $6*10^{19}/cm^3$ Be, squares: $3*10^{18}/cm^3$ Be. The values for the as-grown layers are shown at the respective growth temperatures. For comparison, the total $[As_{Ga}]$ of the undoped reference layers are also given (open triangles).

The thermal stability of the As antisite defects was investigated for selected layers (250 deg. C. & $6*10^{19}/cm^3$ Be/295 deg. C. & $3*10^{18}/cm^3$ Be). FIG. 5 gives the changes of the $As_{Ga}$ concentrations after 600 deg. C. and 700 deg. C. annealing (30 minutes). After 600 deg. C. annealing the As antisite concentrations remain almost constant in both layers. However, in the higher Be-doped layer, the $[As_{Ga}]$ is significantly reduced after 700 deg. C. annealing, while the fairly balanced LT-GaAs:Be contains stable As antisites. $As_{Ga}$ concentrations of $3*10^{18}/cm^3$ can be thermally stabilized for 30 minutes at temperatures $T_A=700$ deg. C. in LT-GaAs:Be, while in undoped LT-GaAs the total $As_{Ga}$ concentration always dropped below the detection limit already after annealing at 600 deg. C. [11].

Figure 6:
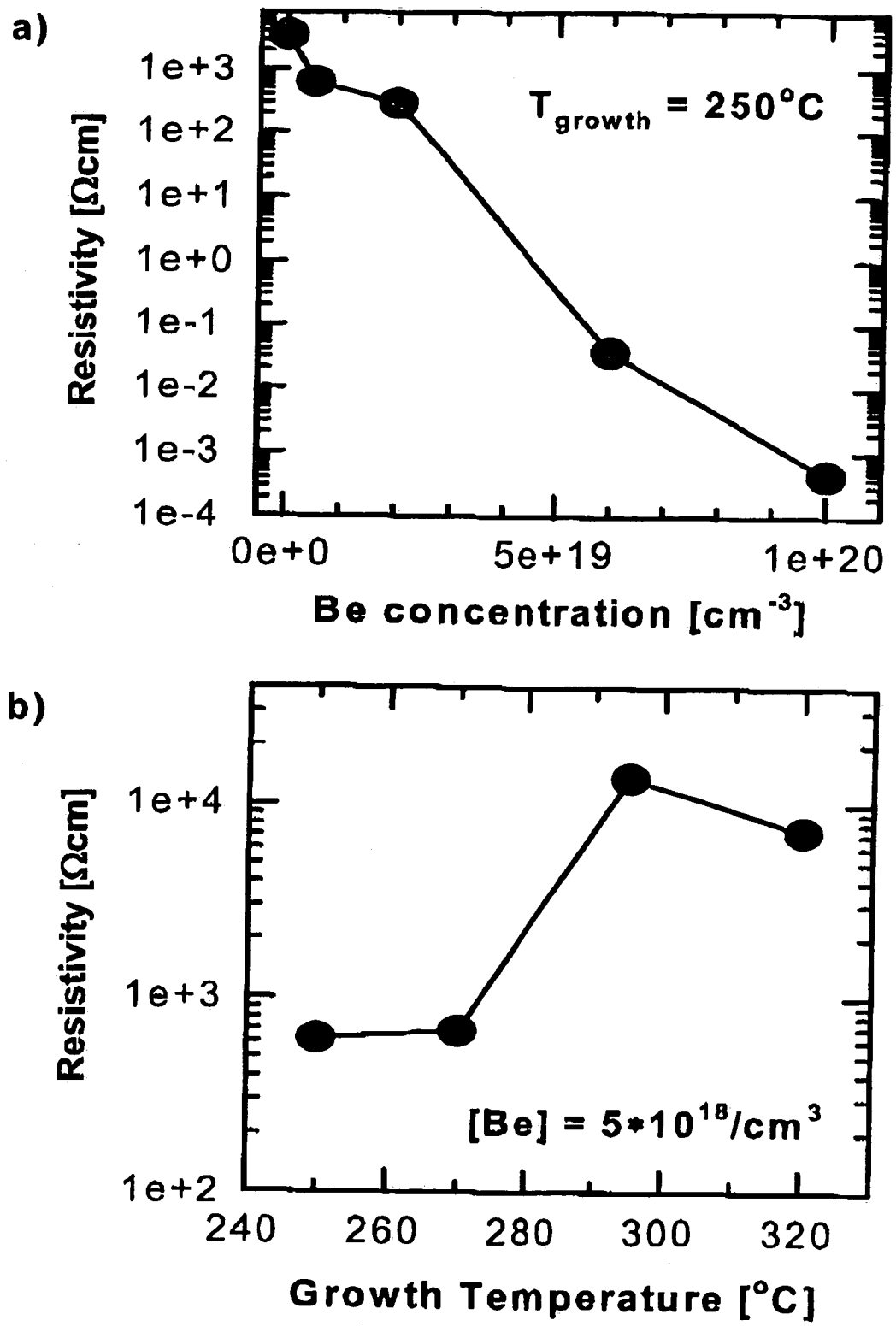
FIG. 6a illustrates resistivity of as-grown LT-GaAs:Be layers dependent on the Be concentration where the growth temperature is 250 deg. C.
FIG. 6b illustrates resistivity of as-grown LT-GaAs:Be layers dependent on the growth temperature where the doping concentration is $5*10^{18}/cm^3$.

The resistivity of undoped LT-GaAs is known to vary dependent on the growth temperature. LT-GaAs grown at low temperatures around 200 deg. C. exhibits low resistivity (with a corresponding low carrier mobility) due to enhanced hopping conduction in the dense $As_{Ga}$ defect bands [20, 21], while LT-GaAs grown around 350 deg. C. is semi-insulating, even without annealing treatment due to a midgap pinned Fermi level. Because Be-doping changes the energy of the Fermi level, the resistivity of the LT-GaAs:Be layers has to be dependent on the doping concentration. FIG. 6a illustrates this dependency, while FIG. 6b shows the growth temperature dependence of LT-GaAs:Be with a constant Be concentration of $5*10^{18}/cm^3$. Upon Be-doping, the resistivity decreases, for the highest Be concentrations the layers become p-type conductive. The growth temperature dependence of the resistivity shows an increase with decreasing $As_{Ga}$ concentration (see FIG. 4b) between 270 deg. C. and 295 deg. C., indicating the influence of hopping conduction.

Figure 7:
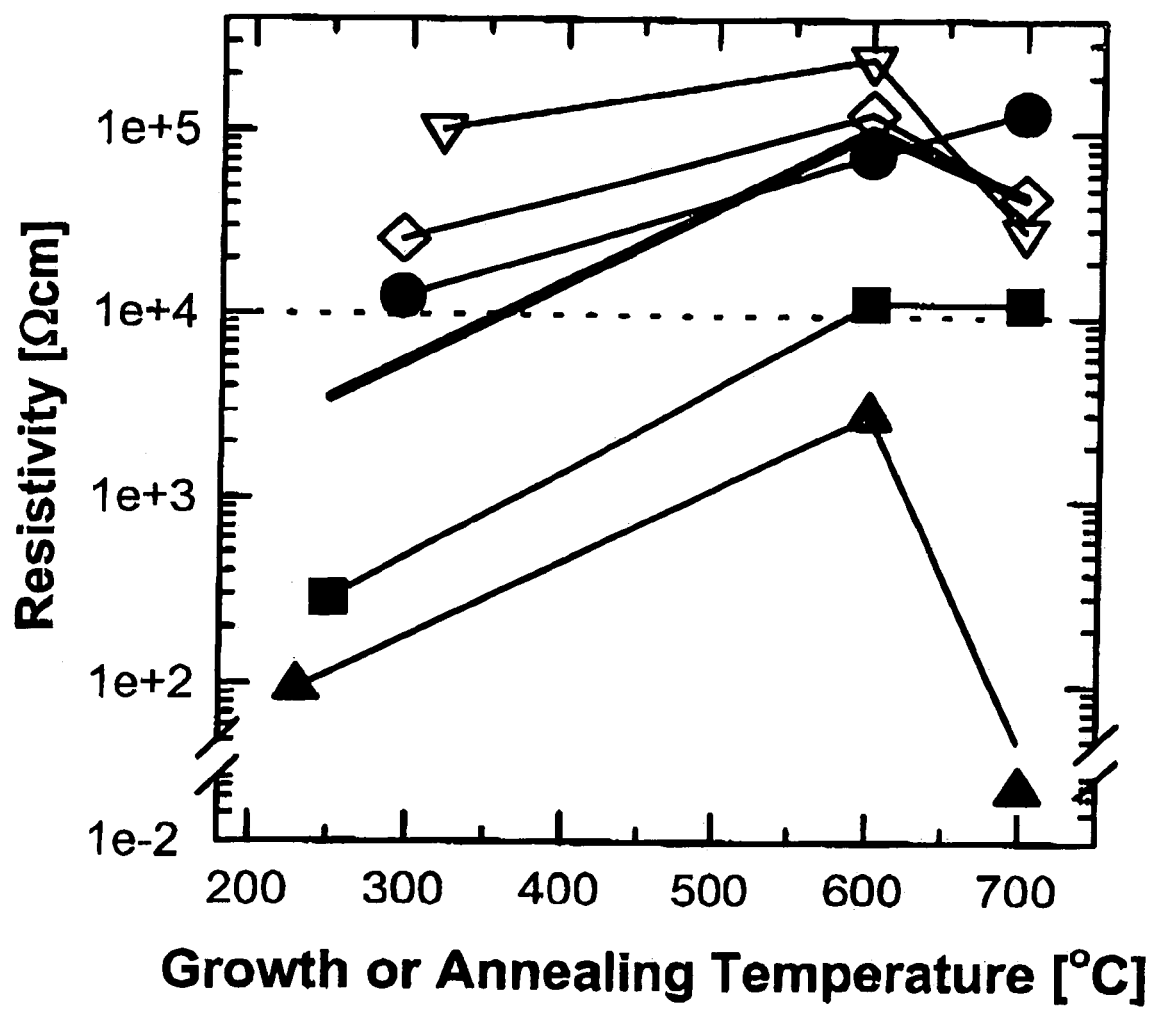
FIG. 7 illustrates the annealing behavior of the resistivity in different lattice matched LT-GaAs:Be layers: open symbols: $3*10^{18}/cm^3$ Be, circles: $5*10^{18}/cm^3$ Be, squares: $2*10^{19}/cm^3$ Be, triangles: $6*10^{19}/cm^3$ Be, thick line: undoped ref.

Annealing at 600 deg. C. usually increases the resistivity, as can be seen in FIG. 7. This tendency is also observed in undoped LT-GaAs, as is also shown for an undoped reference sample. Annealing at 700 deg. C. can lead to p-type conductive layers, fairly balanced layers, however, remain highly resistive if grown above 240 deg. C.

Figure 8:
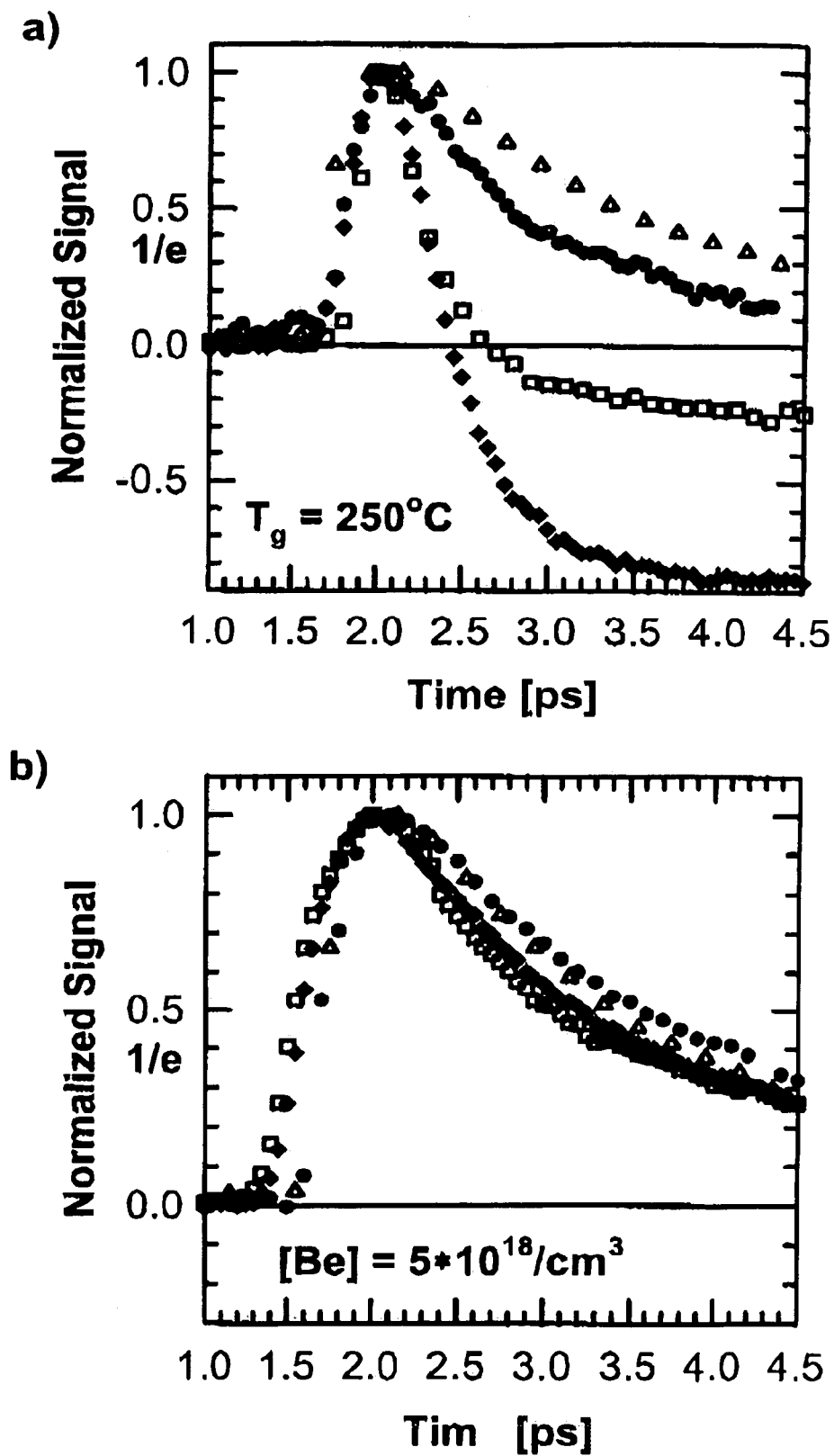
FIG. 8a illustrates time resolved reflectivity transients of as-grown LT-GaAs:Be layers for different Be doping concentrations: open triangles: $5*10^{18}/cm^3$, filled circles: $2*10^{19}/cm^3$ Be, open squares: $6*10^{19}/cm^3$ Be, filled diamonds squares: $1*10^{20}/cm^3$ Be.
FIG. 8b illustrates time resolved reflectivity transients of as-grown LT-GaAs:Be for different growth temperatures: open triangles: 250 deg. C., filled circles: 270 deg. C., open squares: 295 deg. C., filled diamonds: 320 deg. C.

FIG. 8a shows the reflectivity transients of the layers grown with different Be concentrations at a growth temperature of 250 deg. C. According to initial expectations, the carrier trapping time was significantly reduced upon Be-doping. Similar results were obtained for all growth temperatures, although the reduction in carrier trapping time increases with increasing growth temperature.

FIG. 8b gives the dependence of the reflectivity transients on the growth temperature in as-grown material with a constant Be concentration of $5*10^{18}/cm^3$. The layers grown at the two highest growth temperatures showed a slightly faster time response than the layers grown below 280 deg. C.

Figure 9:
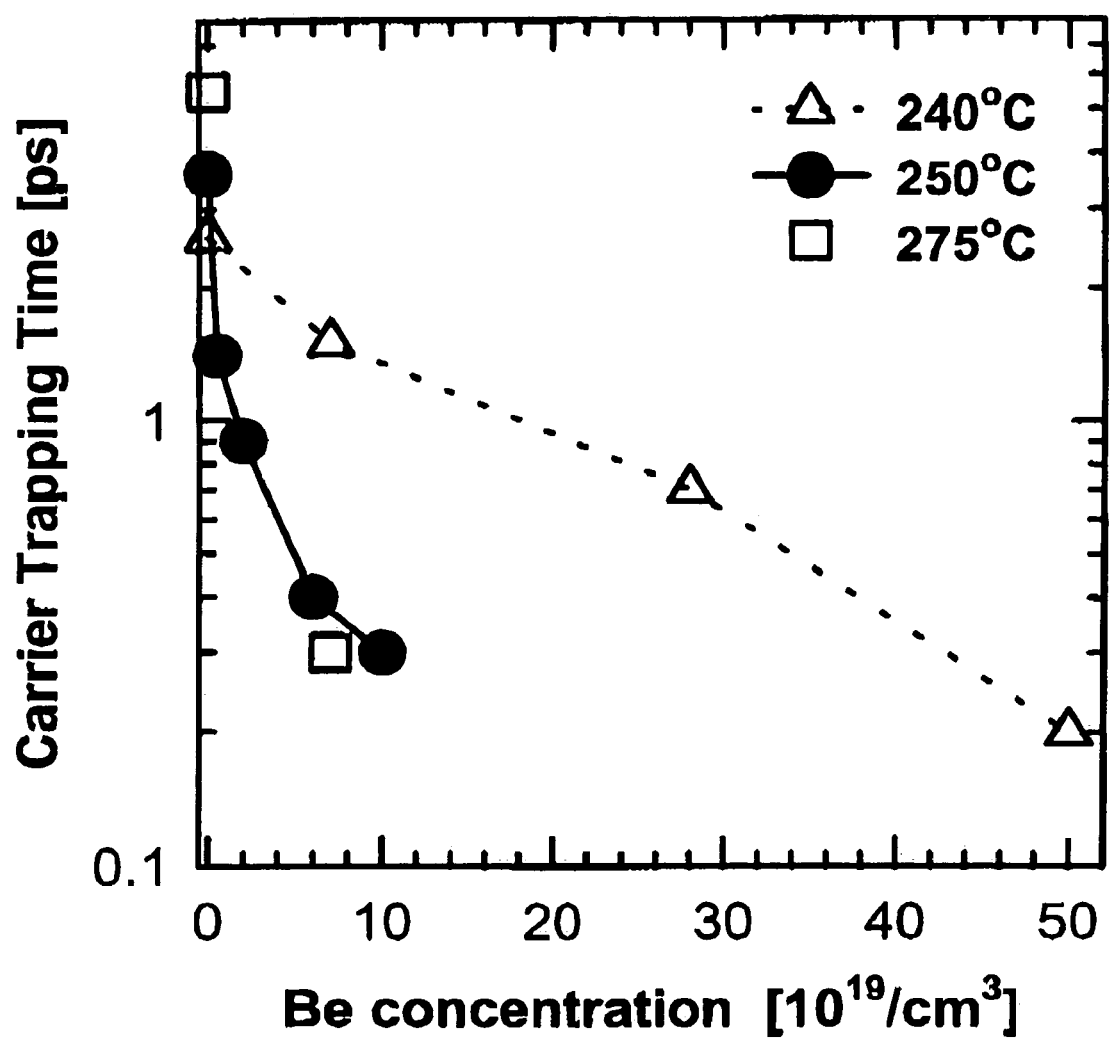
FIG. 9 illustrates carrier trapping time versus the Be doping concentration for different growth temperatures.

FIG. 9 summarizes the obtained time response for different growth temperatures and Be concentrations to demonstrate the different reduction rate of the time response. The data were obtained by an exponential fit of the decay of the reflectivity transients. A decrease in carrier trapping time (CTT) of more than one order of magnitude can be achieved with $7*10^{19}/cm^3$ Be for $T_G=275$ deg. C., whereas for LT-GaAs, grown at $T_G=240$ deg. C., at least $3*10^{20}/cm^3$ Be are required to achieve a similar reduction.

Figure 10:
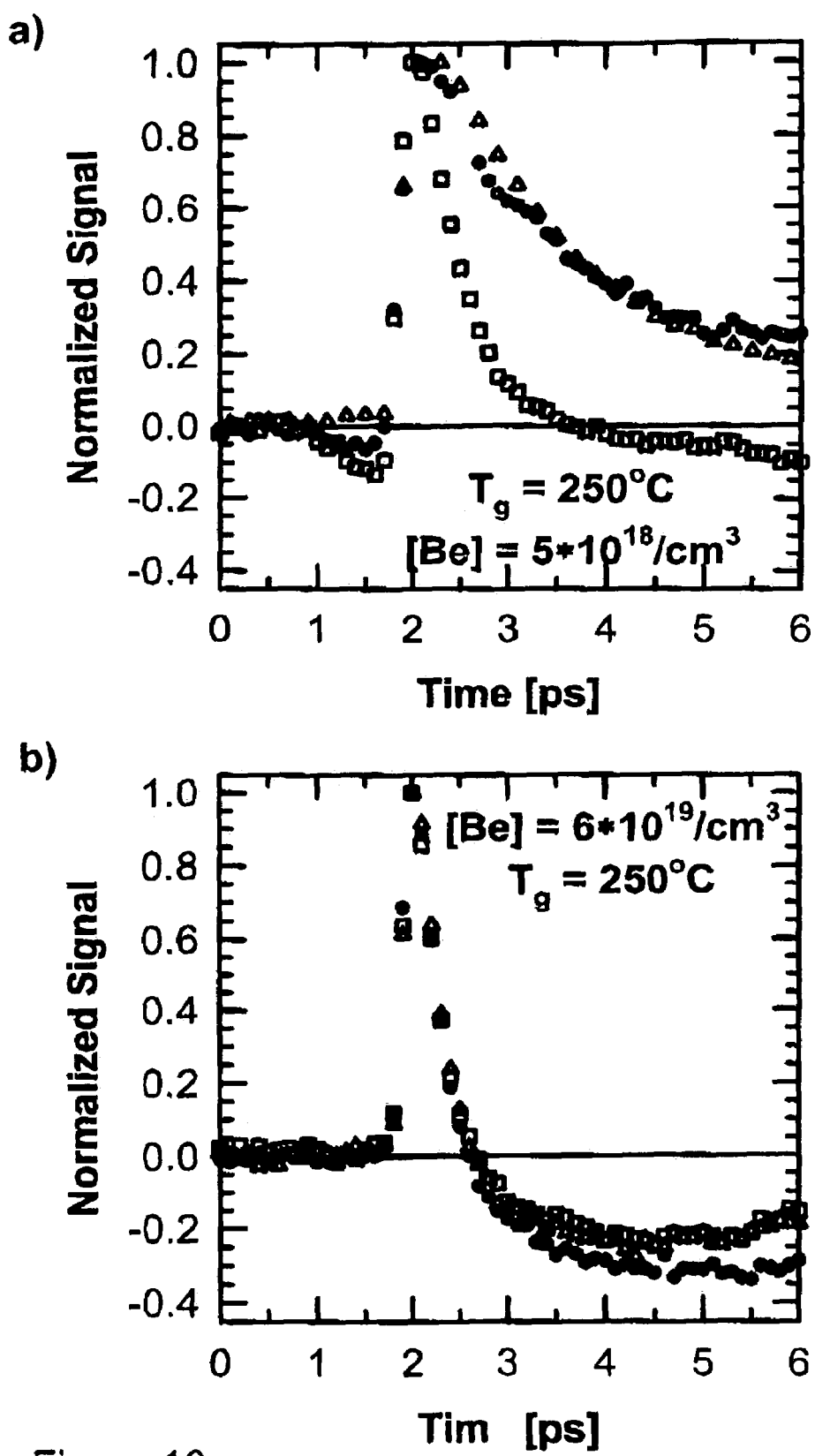
FIG. 10a illustrates annealing behavior of the carrier trapping time for LT-GaAs:Be layers grown at 250 deg. C. and a Be concentration of $5*10^{18}/cm^3$: open triangles: as-grown, filled circles: annealed @ 600 deg. C., open squares: annealed @ 700 deg. C.
FIG. 10b illustrates annealing behavior of the carrier trapping time for LT-GaAs:Be layers grown at 250 deg. C. and a Be concentration of $6*10^{19}/cm^3$: open triangles: as-grown, filled circles: annealed @ 600 deg. C., open squares: annealed @ 700 deg. C.

In FIGS. 10a and 10b, the changes in the time-resolved transients upon thermal annealing are shown. Overall, only small changes were observed between the transients recorded for as-grown and at 600 deg. C. annealed layers in contrast to the annealing behavior of the lattice mismatch, which is a similar behavior to the one observed in undoped LT-GaAs [13]. Upon thermal annealing at 700 deg. C., however, the carrier trapping times for the low doped LT-GaAs layers—as shown in FIG. 10a—decreased significantly. The highly doped LT-layers show ultrafast time response for all annealing conditions (FIG. 10b).

Be-doping of LT-GaAs is beneficial in several respects, as discussed below.

Lattice Mismatch

The tetragonal distortion of the LT-layers, $\Delta c/c$, decreases upon Be-doping. This is to be expected because the Be acceptor is much smaller than the host atom Ga (see reference curve in FIG. 1) and, therefore, can compensate the strain caused by the incorporation of $As_{Ga}$. The amount of strain compensation, however, is much higher than expected, assuming an additive strain of the neutral point defects as described in Eq. 1.

$$\frac{1}{L} \times \sum_{pds} \left(\frac{\Delta c}{c}\right)_{pds} \times N_{pds} = \frac{\Delta c}{c} \qquad \text{(Eq. 1)}$$

L is the number of the Ga sublattice sites ($L=2.2*10^{22}/cm^3$), the point defect species (pds) are $Be_{Ga}^-$ and $As_{Ga}^0$, $N_{pds}=[As_{Ga}^0]$ and $[Be_{Ga}^-]$ and the lattice mismatch unit for each point defect is $(\Delta c/c)_{pds}$. The lattice mismatch unit of the Be acceptors in pseudomorphically grown GaAs ($T_G=600$ deg. C.) epilayers is $(\Delta c/c)_{Be}=-0.117\pm0.005$ [14], the corresponding value for $As_{Ga}^0$ in LT-GaAs is $(\Delta c/c)_{As(0)}=+0.263\pm0.005$ [14]. This transfers according to Vegard's law into the bonding radii of the point defects:

$r(Be_{Ga})=(0.229\pm0.002)$ nm/$r(As_{Ga}^0)=(0.275\pm0.002)$ nm

Consequently, it was expected that more than twice as many Be as $As_{Ga}$ were needed to compensate the strain in LT-GaAs:Be. However, in all observed layers, strain compensation is achieved with similar Be and $As_{Ga}$ concentrations. Therefore, it is concluded that the combination of ionized donors and acceptors, $As_{Ga}^+$ & $Be_{Ga}^-$, do not contribute to the lattice mismatch. The charge neutrality in the layer requires that for each ionized $As_{Ga}$ defect, one Be acceptor is also ionized because the native acceptor, the gallium vacancy $V_{Ga}$, is not present in significant concentrations [22]. For all non-conducting layers, the calculated lattice mismatch using Eq. 1 and the three point defect species with $(\Delta c/c)_{pds}=+0.117\pm0.008$ for the ionized $As_{Ga}^+$ is in good agreement with the measured $\Delta c/c$.

Table 2 gives the results of this calculation. Also in FIG. 2 the Be concentration necessary for lattice matched layers is shown. The corresponding bonding radius of the ionized $As_{Ga}$ amounts to $r(As_{Ga}^+)=(0.259\pm0.002)$ nm.

If the Fermi level in LT-GaAs:Be drops below midgap and the layers become p-type, another defect must be present. The ionized As antisite concentration $[As_{Ga}^+]$ plus the hole concentration $[p]$ as determined from Hall measurements do not match the Be doping concentration any longer, although SIMS measurements show that the Be is still incorporated in the layers (for non-conducting layers, the ionized $As_{Ga}^+$ concentration matched the applied Be-doping concentration within the measuring errors). Also the lattice mismatch as calculated from Eq. 1 does not fit with three point defect species. The difference $\Delta[Be_{Ga}]$ from Eq. 2:

$$\Delta[Be_{Ga}]=[Be]-[p]_{Hall}-[As_{Ga}^+]_{MCD} \quad (Eq.\ 2)$$

could be interstitial Be. However, beryllium that is not incorporated on substitutional sides is a fast diffuser which should be detected in the SIMS profiles of annealed LT-GaAs:Be as a significant decrease if compared to SIMS profiles of as-grown layers. Such a decrease was never observed. If all Be atoms are substituting Ga atoms, the difference between the applied doping concentration and the sum of $[p]$Hall and $[As_{Ga}^+]_{MCD}$ has to be compensated by another donor because of the layers charge neutrality. One possible candidate is the doubly charged $As_{Ga}^{++}$. The double donor level $As_{Ga}^{+/++}$ is located in the band gap at 0.52 eV above the valence band [23] and therefore it is likely to be present in p-conductive layers. However, at present we cannot experimentally determine the $As_{Ga}^{++}$ concentration directly. Assuming $As_{Ga}^{++}$ to be present in concentrations which account for the above discussed differences in charge, its lattice mismatch can be estimated with $(\Delta c/c)_{pds}=+0.07\pm0.01$.

Table 2 gives the different point defect concentrations of several LT-GaAs:Be layers (see Table 1 for the wafer notation). The calculated $[As_{Ga}^{++}]$ is of course just a first approximation. However, if one determines the total $As_{Ga}$ concentration out of these numbers this value seems to saturate at the total $As_{Ga}$ concentration of the undoped LT-GaAs grown with the same growth parameters ($T_G$ & BEP ratio) for Be concentrations approaching similar values. Summarized, the bonding radii of the different point defects contributing to the lattice mismatch are (with the host atom $r(Ga_{Ga})=0.245$ nm):

| | | |
|---|---|---|
| $As_{Ga}^0$: | $(\Delta c/c)_{pds} = +0.263$ | $r = 0.275$ nm |
| $Be_{Ga}^-$: | $(\Delta c/c)_{pds} = -0.117$ | $r = 0.23$ nm |
| $As_{Ga}^+$: | $(\Delta c/c)_{pds} = +0.117$ | $r = 0.26$ nm |
| $As_{Ga}^{++}$: | $(\Delta c/c)_{pds} = +0.07$ | $r = 0.25$ nm |

It is not yet clear if a complex formation between the $As_{Ga}$ and the $Be_{Ga}$, which was suggested earlier [24] is present. If such a complex would lead to a change in the absorption signal of the MCD, this complex could also correlate to the missing positive charge. Present results do not yet allow us to distinguish between these alternatives. A complex in the Ga-sublattice is not a new concept. The existence of $Si_{Ga}$—$V_{Ga}$ complexes in Si-doped GaAs was recently directly confirmed by STM observations with accompanying slow positron annihilation [25]. The concentration of the $V_{Ga}$ is far too low to play a role in strain compensation of LT-GaAs:Be. Furthermore, it is not likely that other impurities in concentrations resulting in lattice distortion are incorporated during the MBE growth, which leaves us with the foregoing explanation.

As Antisite Concentrations

The As antisite concentrations show a characteristic behavior dependent on the Be-doping level and the growth temperature. The $As_{Ga}^+$ concentration follows the Be doping level until all antisites are singly ionized. A decrease of the $[As_{Ga}^+]$ occurs with the onset of p-type conductivity (see FIG. 4a). However, it may be assumed that the total antisite concentration stays almost constant but some As antisites become doubly charged. The concentration of doubly charged antisites is, under this assumption, simply the difference between the measured concentrations of singly ionized and neutral antisites and the total concentration of antisites in the undoped LT-GaAs. The sum of ionized antisites with the calculated doubly charged fraction counting twice and the free (hole) carrier concentration was found to match the Be-doping concentration in the few cases we grew p-conductive layers (see Table 2). The transition to p-type conductivity can also be expressed by a change in the sign of the lattice mismatch as was shown before: P-conductive layers have a negative lattice mismatch to the GaAs substrate. It is expected that the layers become p-type conductive if the Be concentration exceeds the total $As_{Ga}$ concentration of the corresponding undoped layer (for 250 deg. C. about $2.7*10^{19}/cm^3$, see also FIG. 2a). A similar trend is observed in FIG. 4b where at the highest growth temperature the $[As_{Ga}^+]$ equals the total $[As_{Ga}]$ and also matches the $[As_{Ga}]$ of the undoped reference layer. A layer grown at 340 deg. C. with a Be concentration of $5*10^{18}/cm^3$ is p-conductive. The change of conductivity also occurs just after the concentration of ionized $As_{Ga}^+$ reached the $As_{Ga}$ concentration of the undoped reference layer.

Balanced LT-GaAs:Be layers are the most stable upon thermal annealing. FIG. 5 shows that $3*10^{18}/cm^3$ ionized $As_{Ga}$ are stable in LT-GaAs:Be grown at 295 deg. C. even after 700 deg. C., while in the p-conductive layer the ionized antisite concentration is reduced below the detection limit of the MCD if 700 deg. C. annealing is applied. This example shows that the ideal (balanced) point defect concentration is not necessary to significantly improve the thermal stability of LT-GaAs:Be, but the point defect concentrations of Be and $As_{Ga}$ have to be similar (The thermally stabilized layer of FIG. 5 still has a measurable concentration of neutral As antisites). Therefore, the growth can be well controlled with reproducible properties of the epilayers. LT-GaAs:Be with a low Be concentration and a high neutral $[As_{Ga}^{0s}]$ behaves similar upon annealing than the undoped LT-GaAs. Only in almost balanced LT-GaAs:Be the $As_{Ga}^+$ is thermally stable at 700 deg. C. It is expected that the $As_{Ga}^+$ are located in close vicinity to the $Be_{Ga}^-$ if their respective concentrations are similar.

A negative lattice mismatch of an LT-GaAs:Be layer does not change upon annealing. Additionally, we did not observe any change in the Be concentration as measured by SIMS. Thus, all concentrations of defects that contribute to this lattice mismatch cannot change significantly, which means that the Be acceptors are similarly stabilized in LT-GaAs:Be than the As antisites. This also supports the hypothesis of a complex formation. If doubly charged antisites are present in these layers they are at least as thermally stable than the singly ionized $As_{Ga}^+$ because even after 700 deg. C. annealing the layers lattice mismatch remained constant. The least thermally stable point defect is, similar to the undoped LT-GaAs [11], the neutral (and locally isolated) $As_{Ga}^0$. This also means that even the compensating acceptors in undoped LT-GaAs, the gallium vacancies $V_{Ga}$, are more stable than the As antisites in undoped LT-GaAs. It was repeatedly suggested that the $V_{Ga}$ may form a complex with the $As_{Ga}$ which may explain these observations (see for example [24]). However, up to now none of these defect complexes were unambiguously identified and the research in this area is still ongoing.

The TEM images showed that after annealing at 700 deg. C., As precipitates are present in LT-GaAs:Be with a low $[As_{Ga}^0]$ (FIG. 3). The sizes and concentration of the precipitates increases with decreasing growth temperature, which indicates that $As_{Ga}$, even if all are ionized, cannot be completely stabilized in any concentration for the given annealing temperature. However, the stabilized $As_{Ga}^+$ concentration achieved so far is of great importance for several device applications.

Generally, the onset of As precipitate formation is expected already after annealing at 600 deg. C. if neutral antisites are present ($[As_{Ga}^0]$ drops below the detection limit of NIRA) but the As clusters may be too small to be observed in conventional TEM analysis.

Resistivity

The resistivity in non p-conductive LT-GaAs:Be epilayers is sensitively dependent on the $As_{Ga}$ concentration and its ionization ratio ($K=[As_{Ga}^+]/[As_{Ga}]$, the compensation factor) and shows the nearest neighbor hopping. Hopping conduction is known to be dominant in undoped LT-GaAs grown at low temperatures [20, 21]. The carrier transport occurs via jumps within a deep level defect band. The temperature dependence of nearest neighbor hopping conductivity is described by the equations 26]:

$$\sigma = \sigma_3 \times \exp\left(\frac{-\varepsilon_3}{K_B T}\right) \quad \text{(Eqs. 3)}$$

$$\sigma_3 = \sigma_0 \times \exp\left(\frac{-1.9}{N_d^{1/3} \times a_0}\right)$$

$$\varepsilon_3 = f(N_d^{1/3}, K)$$

The index 3 is a traditional notation, $\varepsilon_3$ is the activation energy for hopping conduction, $N_d$ is the defect concentration in the defect band, which here is equivalent to the total As antisite concentration $[As_{Ga}]$, ($N_d^{-1/3}$) is the mean distance between the defects) and K is the compensation factor of the defect band. The localization parameter of the defect wave function $a_0$ was determined for LT-GaAs to $a_0=0.8$ nm [20].

Temperature dependent Hall measurements showed a reduction in the hopping activation energy for Be-doped LT-GaAs from 130 meV (undoped LT-GaAs) to 50 meV. $\varepsilon_3$ is similar for very different compensation ratios, but significantly decreases again to a value around 40 meV if the $As_{Ga}^{0/+}$ defect band is completely emptied (K=1.0). This activation energy is probably the hopping activation energy of the $As_{Ga}^{+/++}$ defect band. The prefactor $\varepsilon_3$ is exponentially dependent on the mean distance between the $As_{Ga}$ defects with a fitting parameter $a_0=0.76$ nm [27], which is in good agreement with the results of Kaminska and Weber [20]. The $As_{Ga}$ concentration clearly dominates the layers electrical conductivity and a controlled incorporation of this defect is essential for the materials applicability. A change of the ionization ratio, however, had only little effect on the hopping activation energy and therewith on the conductivity of Be-doped layers.

Carrier Trapping Time (CTT)

The knowledge of the As antisite concentrations allows one to analyze the carrier trapping times as determined from the reflectivity transients. The decrease of the CTT with increasing Be concentration (FIG. 9) was expected due to the increase in the concentration of ionized antisites $[As_{Ga}^+]$. However, the decrease of the CTT with increasing growth temperature for epilayers with a constant Be doping concentration (shown in FIG. 8a and FIG. 8b) was quite unexpected. It can only be described by the formation of a more effective trapping center, additional trapping centers with similar time response or due to less interaction with other defects, which might increase the effective carrier cross section. The presence of an additional trapping center, probably $As_{Ga}^{++}$, is likely for the p-conductive layers with the highest doping concentrations (FIG. 8a), as discussed above.

The change in $[As_a^+]$ alone does not account for the development of the carrier trapping time with Be-doping in as-grown layers. While in undoped LT-GaAs ($T_G$=200 deg. C.) $10^{18}/cm^3$ $As_{Ga}^+$ result in CTT=0.2 ps [13] even $2*10^{19}/cm^3$ $As_{Ga}^+$ in LT-GaAs:Be ($T_G$=250 deg. C., FIG. 7b) still give CTT=0.9 ps. In both layers additional ionized donors (with possibly large carrier capture cross sections) are not expected in high concentrations because the Fermi Level is still located in the upper defect level $As_{Ga}^{0/+}$. It appears that different traps influence the measured carrier trapping time in undoped and Be-doped LT-GaAs. According to the Shockley-Read-Hall theory, the inverse carrier trapping time of a deep carrier trap can be calculated as follows:

$$1/\tau = <v_{th}> * N_T * \sigma_{eff} \quad \text{(Eq. 4)}$$

with: $\tau$: carrier trapping time, $<v_{th}>$: mean thermal velocity, $N_T$: concentration of the deep trapping center. The mean thermal velocities for electron, light and heavy holes in GaAs at T=300K are $1.77*10^7$ cm/s, $1.76*10^7$ cm/s and $0.68*10^7$ cm/s, respectively [28]. Trapping of hot electrons, which is also possible, is not treated here. Also, a possible interaction between the traps in the layers with the highest defect concentrations was neglected.

Figure 11:
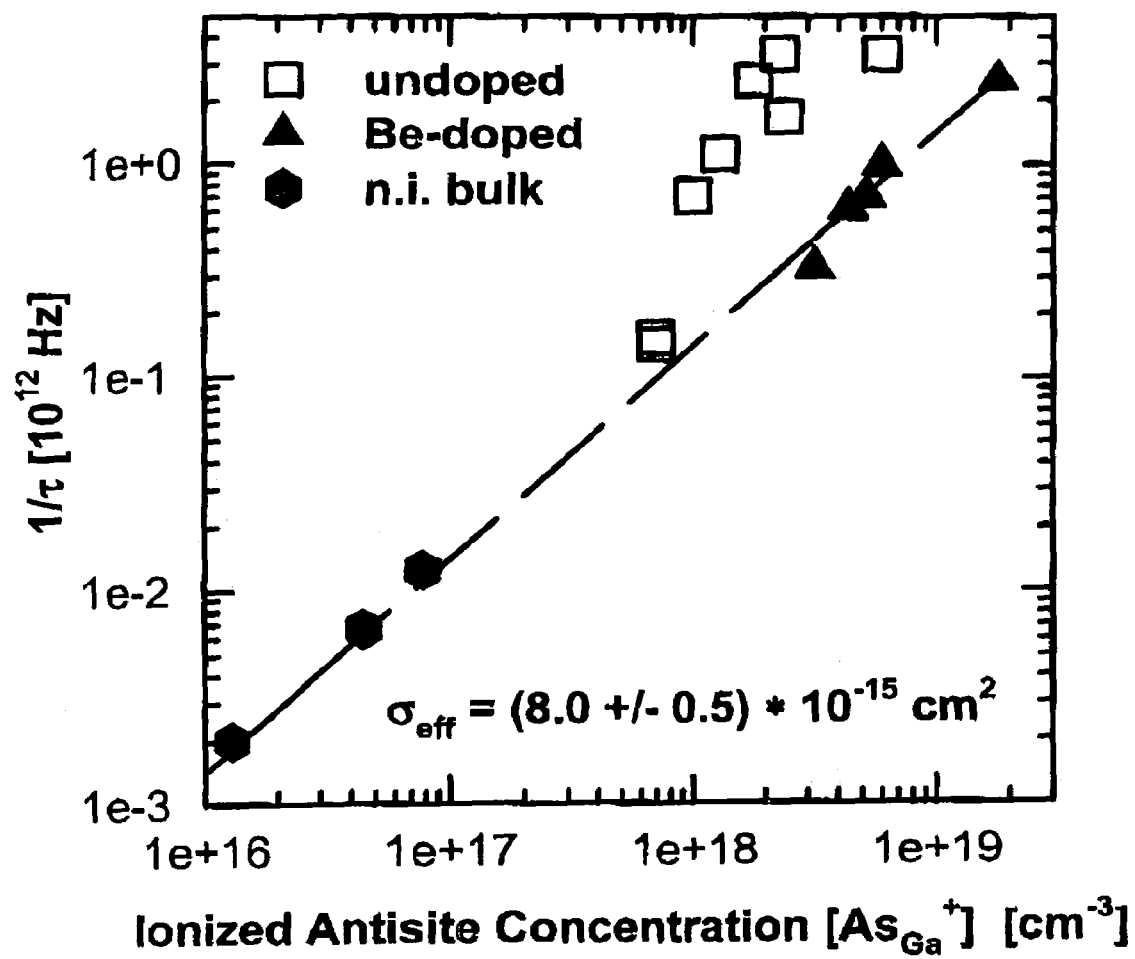
FIG. 11 illustrates carrier trapping in As-rich GaAs, the solid line presents the fit for a single carrier trap, $As_{Ga}^+$ as electron hole trap as determined from Eq. 4. Open squares: LT-GaAs, filled triangles: LT-GaAs:Be, filled circles: neutron irrad. bulk GaAs.

In a first step, ionized antisite concentrations and the corresponding carrier trapping times were collected from already published data from as-grown As-rich GaAs [13, 29, 14] and plotted in FIG. 11 together with the new results of LT-GaAs:Be layers described in this work. Assuming two independent carrier traps with one of them being the electron trap $As_{Ga}^+$, only the data obtained from layers with a high filling factor of the $As_{Ga}$ defect band ($[As_{Ga}^+]/[As_{Ga}]$), namely the Be-doped layers and the neutron irradiated bulk GaAs [29] were fitted with the above given thermal velocity of electrons and the corresponding ionized antisite concentration. The fit-parameter was the effective carrier capture cross section of the $As_{Ga}^+$ that was determined to:

$$\sigma_{electron}(As_{Ga}^+) = (8.0 \pm 0.5) * 10^{-15} \text{ cm}^2$$

The dashed line in FIG. 11 gives the fitted relation. If one considers the fact that the measured defect concentrations expand over three orders of magnitude the fitted data match astonishingly well with both the Be-doped LT-GaAs and the neutron irradiated bulk GaAs. In neutron irradiated GaAs the previously derived effective electron capture cross section of $8.6*10^{-15}$ cm$^2$ [29] is consequently similar to the fit parameter given here.

On the other hand, undoped LT-GaAs exhibits carrier lifetimes which do not fit into the above relation, see FIG. 11. Considering the fact that in these layers only a few percent of the $As_{Ga}$ defects are ionized, it is also possible that hole trapping of the neutral $As_{Ga}^0$ plays a role in the observed reflectivity transients. In undoped LT-GaAs layers grown at the lowest growth temperatures, electron trapping may even be suppressed and the optical transients can then be determined by hole trapping (only 1% to 2% ionized As antisites). A corresponding effective carrier capture cross section, however, is difficult to determine with the Shockley-Read-Hall equation because of the extremely high trap concentration of about $10^{20}/cm^3$. An approximation which is probably already influenced by trap interactions which may increase the value gives about $10^{-15}$ cm$^2$ for an effective hole capture cross section of the neutral As antisite.

The estimated hole capture cross section is lower but still of the same order of magnitude than the results obtained by DLTS [30]. Zaidi et al. determined the hole capture cross section $\sigma_{eff}$ to $5*10^{-15}/cm^2$. Plastically deformed GaAs and annealed LT-GaAs contain dislocations and As precipitates, respectively, which may also act as carrier traps. Therefore, the determination of $\sigma_{eff}$ in plastically deformed GaAs [31] and the hypothesis of different carrier traps present in annealed LT-GaAs [18] account for different traps and cannot be compared with this analysis. The electron capture cross section of EL2 determined by Mitonneau et al. [32] is about two orders of magnitude lower than $\sigma_{eff}$ obtained from the neutron irradiated bulk GaAs [29] and the fit given in this work. Because in [32] the influence of the prominent deep level impurity Cr is still a matter for debate (see, e.g., [29, 30]), this additional trap might account for a part of the large difference.

Summarizing, analysis suggests that the dominant carrier trapping process in LT-GaAs:Be is electron capture at ionized $As_{Ga}^+$ while in undoped LT-GaAs another trap, possibly the neutral $As_{Ga}$, may dominate the optical transients by hole capture.

The annealing behavior of the carrier trapping time in low-doped LT-GaAs:Be (FIG. 10a) can be described as an initial decrease of neutral antisites $As_{Ga}^0$ (FIG. 5), which do not influence the CTT because of the dominant electron trapping at $As_{Ga}^+$ which are stable upon annealing at 600 deg. C. The decrease in CTT occurs if the $[As_{Ga}]$ becomes smaller than the [Be] and some of the $As_{Ga}^+$ become doubly charged. (At present, the doubly charged As antisite concentration cannot be determined experimentally). This also explains why the high-doped LT-GaAs:Be does not show any difference in CTT upon thermal annealing (FIG. 10b), because in these layers $As_{Ga}^{++}$ are probably already present in the as-grown layers. This hypothesis includes the assumption that $As_{Ga}^{++}$ is a more effective electron trap than the singly charged $As_{Ga}^+$ (cf. [14], a first estimation for the effective carrier capture cross section of $As_{Ga}^{++}$ gives $(6\pm2)*10^{14}$ cm$^2$). Furthermore, the $As_{Ga}^{++}$, which are the assumed dominant carrier capture centers in high-doped LT-GaAs:Be, are stable even after an annealing step of 30 minutes at 700 deg. C.

Those skilled in the art will recognize that the techniques of the invention are not limited to GaAs, which was merely used for illustrative purposes. The physical properties associated with this invention allow one to produce highly semi-insulating buffer layers in AlGaAs, InGaAs, InAlAs, and InP.

Although various embodiments which incorporate the teachings of the present invention have been shown and described in detail herein, those skilled in the art can readily devise many other varied embodiments that still incorporate these teachings.

PUBLICATIONS INCORPORATED BY REFERENCE

The contents of the following publications are incorporated herein by reference in their entirety. The numbers are used to identify the references in the specification.
1. Smith and Calawa, *Appl. Phys. Lett.*, 42:818 (1988);
2. Gupta et al., *IEEE J. Quantum Electron.*, 28:2464 (1992);
3. Gupta et al., *Appl. Phys. Lett.*, 59:3276 (1991);
4. Weatherford et al., *IEEE Trans. Nucl. Sci.*, NS-44:2298 (1997);
5. Look, *J. Appl. Phys.*, 70:3148 (1991);
6. Kaminska et al., *Proc. of 6th Conf. on Semi-insulating III-V Materials*, Toronto, Canada, p. 111 (1990);
7. Liu et al., *Appl. Phys. Lett.*, 67:279 (1995);
8. Luysberg et al., *J. Appl. Phys.*, 83:561 (1998);
9. Liliental-Weber, *Mat. Res. Soc. Symp. Proc.*, 198:371 (1990);
10. Melloch et al., *Appl. Phys. Lett.*, 57:1531 (1990);
11. Liu et al., *Appl. Phys. Lett.*, 65:3002 (1994);
12. Lin et al., *IEEE*, ED37:46 (1990);
13. Liliental-Weber et al., *Proc. of the 8th Conf. on Semiinsulating III-V Materials*, ed. M. Godlewski, p. 305 (World Scientific, 1994);
14. Specht et al., *Mater. Sci. Forum*, 258–263:951 (1997);
15. Weilmeier et al., *Can. J. Phys.*, 69:422 (1991);
16. Siegner et al., *Appl. Phys. Lett.*, 69:2566 (1996);
17. Grenier and Whitaker, *Appl. Phys. Lett.*, 70:1998 (1997);
18. Sosnowski et al., *Appl. Phys. Lett.*, 70:3245 (1997);
19. Melloch et al., *Appl. Phys. Lett.*, 61:177 (1992);
20. Kaminska and Weber, *Proc. of the 20th Int. Conf. on the Physics of Semicond.*, edited by: E. M. Anastassakis and J. D. Joannopoulos, p. 473 (World Scientific 1990);
21. Look et al., *Phys. Rev., B* 42:3578 (1990);
22. Boerner et al., to be published;
23. Weber et al., *J. Appl. Phys.*, 53:6140 (1982);
24. Bliss et al., *Mat. Res. Soc. Symp. Proc.*, 241:93 (1992);
25. Gebauer et al., *Phys. Rev. Lett.*, 78:3334 (1997);
26. Shklovskii and Afros, *Electronic Properties of Doped Semiconductors*, Springer series in Solid-State Sciences 45, Berlin (1984);
27. Lutz et al., *MRS Symp. Proc.*, 510:55 (1998);
28. Electron & hole masses were taken from S. M. Sze: *Physics of Semiconductor Devices*, second edition, John Wiley & Sons, Inc., New York, 1981, Appendix H;
29. Krueger et al., *Proc. of the IEEE SIMC*-9, Toulouse, p. 345 (1996);
30. Zaidi et al., *Appl. Phys. Lett.*, 61:2452 (1992);
31. Oestreich et al., *J. of Luminescence*, 58:123 (1994); and
32. Mitonneau et al., *Rev. Phys. Appl.*, 14:853 (1979).

The invention claimed is:

1. A method of improving the thermal stability of a compound semiconductor material comprising:
   depositing a layer of said compound semiconductor material including therein acceptors; and
   wherein said acceptors have an electronic energy level below the midgap energy level of the neutral antisite defects of said compound semiconductor material; and
   wherein the concentration of said acceptors is balanced with the concentration of said antisite defects; and
   wherein said improved thermal stability is such that the properties of said compound semiconductor material are substantially unaffected by subsequent high temperature processing of said compound semiconductor material.

2. A method as in claim 1 wherein said compound semiconductor material is selected from the group consisting of III–V semiconductor material, InGaAs and AlGaP.

3. A method as in claim 1 wherein said acceptors are selected from the group consisting of C, Be, Zn, Mg, Fe, Cu, Mn and Ni.

4. A method as in claim 1 wherein said acceptors are Be and said compound semiconductor material is LT-GaAs.

5. A method as in claim 4 wherein said LT-GaAs is deposited by molecular beam epitaxy at a temperature in the range from approximately 200° C. to approximately 400° C.; and wherein said LT-GaAs is doped during growth with Be at a temperature greater than approximately 230° C.

6. A method of producing a compound semiconductor material having short carrier trapping times comprising:

depositing a layer of said compound semiconductor material including therein acceptors; and wherein said acceptors have an electronic energy level below the midgap energy level of the neutral antisite defects of said compound semiconductor material; and wherein the concentration of said acceptors is balanced with the concentration of said antisite defects; and wherein said carrier trapping times are less than the carrier trapping times of said compound semiconductor material lacking said acceptors.

7. A method as in claim 6 wherein said compound semiconductor material is selected from the group consisting of III–V semiconductor material, InGaAs and AlGaP.

8. A method as in claim 6 wherein said acceptors are selected from the group consisting of C, Be, Zn, Mg, Fe, Cu, Mn and Ni.

9. A method as in claim 6 wherein said acceptors are Be and said compound semiconductor material is LT-GaAs.

10. A method as in claim 4 wherein said LT-GaAs is deposited by molecular beam epitaxy at a temperature in the range from approximately 200° C. to approximately 400° C.; and wherein said LT-GaAs is doped during growth with Be at a temperature greater than approximately 230° C.; and wherein said carrier trapping times are less than approximately 5.5 picoseconds.

* * * * *